United States Patent
Kadota et al.

(10) Patent No.: US 7,902,718 B2
(45) Date of Patent: Mar. 8, 2011

(54) BOUNDARY ACOUSTIC WAVE DEVICE

(75) Inventors: Michio Kadota, Kyoto (JP); Tetsuya Kimura, Ohmihachiman (JP)

(73) Assignee: Murata Manufacturing Co., Ltd., Kyoto (JP)

(\*) Notice: Subject to any disclaimer, the term of this patent is extended or adjusted under 35 U.S.C. 154(b) by 0 days.

(21) Appl. No.: 12/862,843

(22) Filed: Aug. 25, 2010

(65) Prior Publication Data
US 2010/0320866 A1    Dec. 23, 2010

Related U.S. Application Data

(63) Continuation of application No. 12/420,944, filed on Apr. 9, 2009, which is a continuation of application No. PCT/JP2007/067583, filed on Sep. 10, 2007.

(30) Foreign Application Priority Data

Oct. 12, 2006   (JP) .................................. 2006-278970

(51) Int. Cl.
*H01L 41/08*   (2006.01)

(52) U.S. Cl. ................................ 310/313 A; 310/313 R

(58) Field of Classification Search .............. 310/313 A, 310/313 R; 333/195
See application file for complete search history.

(56) References Cited

U.S. PATENT DOCUMENTS

| | | | | |
|---|---|---|---|---|
| 7,322,093 B2* | 1/2008 | Kadota et al. | ................... | 29/594 |
| 7,550,898 B2* | 6/2009 | Kadota et al. | ................. | 310/320 |
| 7,581,306 B2* | 9/2009 | Kadota et al. | ................... | 29/594 |
| 7,688,161 B2* | 3/2010 | Miura et al. | ................. | 333/193 |

OTHER PUBLICATIONS

Kadota et al., "Boundary Acoustic Wave Device"; U.S. Appl. No. 12/420,944, filed Apr. 9, 2009.

\* cited by examiner

*Primary Examiner* — Mark Budd
(74) *Attorney, Agent, or Firm* — Keating & Bennett, LLP

(57) ABSTRACT

A boundary acoustic wave device includes a $LiNbO_3$ substrate having a plurality of grooves provided in the upper surface thereof, electrode layers which are defined by a metal material filled in the grooves and which include IDT electrodes, and a dielectric layer, such as a $SiO_2$ layer, provided over the upper surface of the piezoelectric substrate and the electrodes. The upper surface of the dielectric layer is flat or substantially flat. The thickness of the electrodes, θ of the Euler angles (0°, θ, −45° to +45°) of the $LiNbO_3$ substrate, and the thickness of the dielectric layer are within any of the ranges shown in Table 1.

3 Claims, 13 Drawing Sheets

θ OF EULER ANGLES (0°, θ, 0°) (DEGREES)

θ OF EULER ANGLES (0°, θ, 0°) (DEGREES)

BOUNDARY ACOUSTIC WAVE DEVICE

BACKGROUND OF THE INVENTION

1. Field of the Invention

The present invention relates to boundary acoustic wave devices used as, for example, resonators or band-pass filters, and particularly, to a boundary acoustic wave device including a piezoelectric body, an electrode defined by a metal embedded in the upper surface of the piezoelectric body, and a dielectric body extending over the piezoelectric body and the electrode.

2. Description of the Related Art

Duplexers (DPXs) and RF filters used in mobile communication systems need to have both broad band-pass properties and good temperature properties. Conventional boundary acoustic wave devices used for such DPXs or RF filters include a piezoelectric substrate made of 36-50 degrees rotated Y-plate X-propagation $LiTaO_3$. The piezoelectric substrate has a temperature coefficient of frequency of −45 ppm/° C. to −35 ppm/° C. A known technique for improving temperature properties is to arrange a $SiO_2$ layer having a positive temperature coefficient of frequency over IDT electrodes arranged on the piezoelectric substrate.

In a structure in which the $SiO_2$ layer extends over the IDT electrodes, unevenness occurs between fingers of the IDT electrodes and spaces between the electrode fingers. That is, a surface of the $SiO_2$ layer cannot be prevented from having differences in height between the IDT electrodes and spaces therebetween. Therefore, there is a problem in that surface irregularities of the $SiO_2$ layer cause a deterioration of insertion loss.

An increase in the thickness of the IDT electrodes necessarily increases the height of the irregularities. Therefore, the thickness of the IDT electrodes cannot be increased.

Recently, boundary acoustic wave devices have been replacing surface acoustic wave devices and have been attracting significant attention because the boundary acoustic wave devices are useful in manufacturing small-size packages. "RF Filter Using Boundary Acoustic Wave" (Proc. Symp. Ultrason. Electron., Vol. 26, pp. 25-26 (2005/11)) discloses a boundary acoustic wave device including a $LiNbO_3$ substrate, IDT electrodes, and a $SiO_2$ layer defining a dielectric body laminated in that order. The IDT electrodes have a relatively large thickness such that the acoustic velocity of an SH-type boundary acoustic wave propagating between the $LiNbO_3$ substrate and the $SiO_2$ layer is less than that of a slow transverse wave propagating in the $SiO_2$ layer. Thus, the SH-type boundary acoustic wave is non-leaky. FIG. 3 of "RF Filter Using Boundary Acoustic Wave" (Proc. Symp. Ultrason. Electron., Vol. 26, pp. 25-26 (2005/11)) shows that the thickness of an IDT electrode that is sufficient for an SH-type boundary acoustic wave to be non-leaky is at least $0.15\lambda$ when the IDT electrode is made of Al, or at least $0.04\lambda$ when the IDT electrode is made of one of Cu, Ag, and Au, wherein $\lambda$ represents the wavelength of the SH-type boundary acoustic wave.

When boundary acoustic wave devices, as well as the boundary acoustic wave device disclosed in "RF Filter Using Boundary Acoustic Wave" (Proc. Symp. Ultrason. Electron., Vol. 26, pp. 25-26 (2005/11)), include IDT electrodes which are made of Au and which have a thickness of at least $0.04\lambda$, frequency properties of the boundary acoustic wave devices vary significantly due to differences in thickness between the electrodes. Therefore, it has been difficult to manufacture boundary acoustic wave devices having good frequency properties with high reproducibility.

SUMMARY OF THE INVENTION

To overcome the problems described above, preferred embodiments of the present invention provide a boundary acoustic wave device which includes electrodes having reduced thickness, which can confine an SH-type boundary acoustic wave between a piezoelectric body and a dielectric body, and which has low loss.

A first preferred embodiment of the present invention provides a boundary acoustic wave device that includes a $LiNbO_3$ substrate which has a plurality of grooves provided in the upper surface thereof and which has Euler angles (0°, θ, −45° to +45°), electrodes defined by metal material filled in the grooves, and a dielectric layer provided over the $LiNbO_3$ substrate and the electrodes. The upper surface of the dielectric layer is flat or substantially flat. The metal material used to define the electrodes is preferably at least one selected from the group consisting of Al, Ti, Ni, Cr, Cu, W, Ta, Pt, Ag, and Au, for example. Al and Ti are grouped into a first group. Ni and Cr are grouped into a second group. Cu, W, Ta, Pt, Ag, and Au are grouped into a third group. The thickness of the electrodes made of the metal materials assigned to each group, θ of the Euler angles of the $LiNbO_3$ substrate, and the thickness of the dielectric layer are within any of ranges shown in Table 1 below.

TABLE 1

α ≦ 0.1
θ of Euler angles (0°, θ, −45° to 45°)

| | | |
|---|---|---|
| 0.04 ≦ Thickness of first group electrode < 0.07 | (0, 76 to 106, −45 to 45) | 0.8 ≦ Thickness of dielectric layer ≦ 2.5 |
| 0.07 ≦ Thickness of first group electrode < 0.1 | (0, 66 to 116, −45 to 45) | 0.8 ≦ Thickness of dielectric layer ≦ 2.5 |
| 0.1 ≦ Thickness of first group electrode ≦ 0.2 | (0, 56 to 125, −45 to 45) | 0.8 ≦ Thickness of dielectric layer ≦ 2.5 |
| 0.01 ≦ Thickness of second group electrode < 0.02 | (0, 71 to 101, −45 to 45) | 0.8 ≦ Thickness of dielectric layer ≦ 3.0 |
| 0.02 ≦ Thickness of second group electrode < 0.06 | (0, 68 to 103, −45 to 45) | 0.8 ≦ Thickness of dielectric layer ≦ 3.0 |
| 0.06 ≦ Thickness of second group electrode < 0.08 | (0, 66 to 109, −45 to 45) | 0.8 ≦ Thickness of dielectric layer ≦ 3.0 |
| 0.08 ≦ Thickness of second group electrode ≦ 0.16 | (0, 61 to 123, −45 to 45) | 0.8 ≦ Thickness of dielectric layer ≦ 3.0 |
| 0.01 ≦ Thickness of third group electrode < 0.02 | (0, 61 to 112, −45 to 45) | 0.8 ≦ Thickness of dielectric layer ≦ 4.0 |
| 0.02 ≦ Thickness of third group electrode < 0.06 | (0, 60 to 122, −45 to 45) | 0.8 ≦ Thickness of dielectric layer ≦ 4.0 |
| 0.06 ≦ Thickness of third group electrode < 0.08 | (0, 56 to 132, −45 to 45) | 0.8 ≦ Thickness of dielectric layer ≦ 4.0 |
| 0.08 ≦ Thickness of third group electrode ≦ 0.10 | (0, 51 to 136, −45 to 45) | 0.8 ≦ Thickness of dielectric layer ≦ 4.0 |

The thickness of each electrode and the thickness of a dielectric layer are normalized thickness H/λ (λ is the wavelength of a boundary acoustic wave).

In the boundary acoustic wave device of the first preferred embodiment, the thickness of the electrodes, θ of the Euler angles of the LiNbO₃ substrate, and the thickness of the dielectric layer are within any of ranges shown in Table 2 below.

TABLE 2

α = 0.1
θ of Euler angles (0°, θ, −45° to 45°)

| | | |
|---|---|---|
| 0.04 ≦ Thickness of first group electrode < 0.07 | (0, 88 to 93, −45 to 45) | 0.8 ≦ Thickness of dielectric layer ≦ 2.5 |
| 0.07 ≦ Thickness of first group electrode < 0.1 | (0, 78 to 111, −45 to 45) | 0.8 ≦ Thickness of dielectric layer ≦ 2.5 |
| 0.1 ≦ Thickness of first group electrode ≦ 0.2 | (0, 78 to 112, −45 to 45) | 0.8 ≦ Thickness of dielectric layer ≦ 2.5 |
| 0.01 ≦ Thickness of second group electrode < 0.02 | (0, 79 to 87, −45 to 45) | 0.8 ≦ Thickness of dielectric layer ≦ 3.0 |
| 0.02 ≦ Thickness of second group electrode < 0.06 | (0, 79 to 89, −45 to 45) | 0.8 ≦ Thickness of dielectric layer ≦ 3.0 |
| 0.06 ≦ Thickness of second group electrode < 0.08 | (0, 79 to 90, −45 to 45) | 0.8 ≦ Thickness of dielectric layer ≦ 3.0 |
| 0.08 ≦ Thickness of second group electrode ≦ 0.16 | (0, 79 to 90, −45 to 45) | 0.8 ≦ Thickness of dielectric layer ≦ 3.0 |
| 0.01 ≦ Thickness of third group electrode < 0.02 | (0, 68 to 103, −45 to 45) | 0.8 ≦ Thickness of dielectric layer ≦ 4.0 |
| 0.02 ≦ Thickness of third group electrode < 0.06 | (0, 68 to 113, −45 to 45) | 0.8 ≦ Thickness of dielectric layer ≦ 4.0 |
| 0.06 ≦ Thickness of third group electrode < 0.08 | (0, 68 to 126, −45 to 45) | 0.8 ≦ Thickness of dielectric layer ≦ 4.0 |
| 0.08 ≦ Thickness of third group electrode ≦ 0.10 | (0, 68 to 140, −45 to 45) | 0.8 ≦ Thickness of dielectric layer ≦ 4.0 |

The thickness of each electrode and the thickness of a dielectric layer are normalized thickness H/λ (λ is the wavelength of a boundary acoustic wave).

A second preferred embodiment of the present invention provides a boundary acoustic wave device that includes a LiTaO₃ substrate which has a plurality of grooves provided in the upper surface thereof and which has Euler angles (0°, θ, −45° to +45°); electrodes defined by a metal material filled in the grooves; and a dielectric layer provided over the LiTaO₃ substrate and the electrodes. The upper surface of the dielectric layer is flat or substantially flat. The metal material used to define the electrodes is preferably at least one selected from the group consisting of Al, Cu, Au, Ta, and Pt, for example. The thickness of the electrodes, θ of the Euler angles of the LiTaO₃ substrate, and the thickness of the dielectric layer are within any of ranges shown in Table 3 below.

TABLE 3

α ≦ 0.1
θ of Euler angles (0°, θ, −45° to 45°)

| | | |
|---|---|---|
| 0.04 ≦ Thickness of Al electrode < 0.08 | (0, 112 to 141, −45 to 45) | 0.8 ≦ Thickness of dielectric layer ≦ 2.5 |
| 0.08 ≦ Thickness of Al electrode < 0.1 | (0, 111 to 142, −45 to 45) | 0.8 ≦ Thickness of dielectric layer ≦ 2.5 |
| 0.1 ≦ Thickness of Al electrode ≦ 0.25 | (0, 110 to 143, −45 to 45) | 0.8 ≦ Thickness of dielectric layer ≦ 2.5 |
| 0.02 ≦ Thickness of Cu electrode < 0.04 | (0, 114 to 142, −45 to 45) | 0.8 ≦ Thickness of dielectric layer ≦ 2.5 |
| 0.04 ≦ Thickness of Cu electrode < 0.08 | (0, 113 to 145, −45 to 45) | 0.8 ≦ Thickness of dielectric layer ≦ 2.5 |
| 0.08 ≦ Thickness of Cu electrode ≦ 0.1 | (0, 108 to 154, −45 to 45) | 0.8 ≦ Thickness of dielectric layer ≦ 2.5 |
| 0.02 ≦ Thickness of Au electrode < 0.03 | (0, 117 to 148, −45 to 45) | 0.8 ≦ Thickness of dielectric layer ≦ 2.5 |
| 0.03 ≦ Thickness of Au electrode < 0.06 | (0, 109 to 159, −45 to 45) | 0.8 ≦ Thickness of dielectric layer ≦ 2.5 |
| 0.06 ≦ Thickness of Au electrode ≦ 0.1 | (0, 103 to 167, −45 to 45) | 0.8 ≦ Thickness of dielectric layer ≦ 2.5 |
| 0.03 ≦ Thickness of Ta electrode < 0.06 | (0, 116 to 145, −45 to 45) | 0.8 ≦ Thickness of dielectric layer ≦ 2.5 |
| 0.06 ≦ Thickness of Ta electrode < 0.08 | (0, 116 to 147, −45 to 45) | 0.8 ≦ Thickness of dielectric layer ≦ 2.5 |
| 0.08 ≦ Thickness of Ta electrode ≦ 0.1 | (0, 111 to 154, −45 to 45) | 0.8 ≦ Thickness of dielectric layer ≦ 2.5 |
| 0.02 ≦ Thickness of Pt electrode < 0.04 | (0, 117 to 143, −45 to 45) | 0.8 ≦ Thickness of dielectric layer ≦ 2.5 |
| 0.04 ≦ Thickness of Pt electrode < 0.08 | (0, 117 to 148, −45 to 45) | 0.8 ≦ Thickness of dielectric layer ≦ 2.5 |
| 0.08 ≦ Thickness of Pt electrode ≦ 0.1 | (0, 110 to 157, −45 to 45) | 0.8 ≦ Thickness of dielectric layer ≦ 2.5 |

The thickness of each electrode and the thickness of a dielectric layer are normalized thickness H/λ (λ is the wavelength of a boundary acoustic wave).

In the boundary acoustic wave device according to the second preferred embodiment, the thickness of the electrodes, θ of the Euler angles of the LiTaO₃ substrate, and the thickness of the dielectric layer are within any of ranges shown in Table 4 below.

TABLE 4

α = 0
θ of Euler angles (0°, θ, −45° to 45°)

| | | |
|---|---|---|
| 0.04 ≦ Thickness of Al electrode < 0.08 | (0, 124 to 128, −45 to 45) | 0.8 ≦ Thickness of dielectric layer ≦ 2.5 |
| 0.08 ≦ Thickness of Al electrode < 0.1 | (0, 124 to 128, −45 to 45) | 0.8 ≦ Thickness of dielectric layer ≦ 2.5 |

TABLE 4-continued

α = 0
θ of Euler angles (0°, θ, −45° to 45°)

| | | |
|---|---|---|
| 0.1 ≦ Thickness of Al electrode ≦ 0.25 | (0, 124 to 128, −45 to 45) | 0.8 ≦ Thickness of dielectric layer ≦ 2.5 |
| 0.02 ≦ Thickness of Cu electrode < 0.04 | (0, 127 to 129, −45 to 45) | 0.8 ≦ Thickness of dielectric layer ≦ 2.5 |
| 0.04 ≦ Thickness of Cu electrode < 0.08 | (0, 127 to 131, −45 to 45) | 0.8 ≦ Thickness of dielectric layer ≦ 2.5 |
| 0.08 ≦ Thickness of Cu electrode ≦ 0.1 | (0, 127 to 135, −45 to 45) | 0.8 ≦ Thickness of dielectric layer ≦ 2.5 |
| 0.02 ≦ Thickness of Au electrode < 0.03 | (0, 135 to 136, −45 to 45) | 0.8 ≦ Thickness of dielectric layer ≦ 2.5 |
| 0.03 ≦ Thickness of Au electrode < 0.06 | (0, 135 to 139, −45 to 45) | 0.8 ≦ Thickness of dielectric layer ≦ 2.5 |
| 0.06 ≦ Thickness of Au electrode ≦ 0.1 | (0, 135 to 140, −45 to 45) | 0.8 ≦ Thickness of dielectric layer ≦ 2.5 |
| 0.03 ≦ Thickness of Ta electrode < 0.06 | (0, 129 to 134, −45 to 45) | 0.8 ≦ Thickness of dielectric layer ≦ 2.5 |
| 0.06 ≦ Thickness of Ta electrode < 0.08 | (0, 129 to 134, −45 to 45) | 0.8 ≦ Thickness of dielectric layer ≦ 2.5 |
| 0.08 ≦ Thickness of Ta electrode ≦ 0.1 | (0, 129 to 136, −45 to 45) | 0.8 ≦ Thickness of dielectric layer ≦ 2.5 |
| 0.02 ≦ Thickness of Pt electrode < 0.04 | (0, 130 to 131, −45 to 45) | 0.8 ≦ Thickness of dielectric layer ≦ 2.5 |
| 0.04 ≦ Thickness of Pt electrode < 0.08 | (0, 133 to 135, −45 to 45) | 0.8 ≦ Thickness of dielectric layer ≦ 2.5 |
| 0.08 ≦ Thickness of Pt electrode ≦ 0.1 | (0, 133 to 138, −45 to 45) | 0.8 ≦ Thickness of dielectric layer ≦ 2.5 |

The thickness of each electrode and the thickness of a dielectric layer are normalized thickness H/λ (λ is the wavelength of a boundary acoustic wave).

In the boundary acoustic wave device according to each preferred embodiment described above, the dielectric layer is preferably made of silicon dioxide, for example. Since silicon dioxide has a positive temperature coefficient of frequency TCF and $LiNbO_3$ and $LiTaO_3$ have a negative temperature coefficient of frequency TCF, a boundary acoustic wave device having a temperature coefficient of frequency with a small absolute value and good temperature properties is provided.

In the boundary acoustic wave device according to the first preferred embodiment, the electrodes are preferably formed by filling the grooves, which are provided in the upper surface of the $LiNbO_3$ substrate, with the metal material and the dielectric layer is provided over the $LiNbO_3$ substrate and the electrodes, and the thickness of the electrodes can be adjusted by varying the depth of the grooves. Therefore, there is substantially no unevenness between electrode-bearing portions and electrode-free portions. Thus, the upper surface of the dielectric layer can be readily planarized and the insertion loss can be reduced.

In addition, the metal material used to define the electrodes is preferably at least one of the metal materials of the first group, those of the second group, and those of the third group and θ of the Euler angles of the $LiNbO_3$ substrate, the thickness of the dielectric layer, and the thickness of the electrodes are within any of the ranges shown in Table 1. Therefore, as shown in the experiments described below, an SH-type boundary acoustic wave can be non-leaky even if the electrodes have a reduced thickness. Thus, a boundary acoustic wave device which utilizes a SH-type boundary acoustic wave and which has low loss can be provided.

When the thickness of the electrodes, θ of the Euler angles, and the thickness of the dielectric layer are any of those shown in Table 2, the loss of the boundary acoustic wave device can be further reduced.

According to the second preferred embodiment, the electrodes are formed preferably by filling the grooves, which are formed in the upper surface of the $LiTaO_3$ substrate, with the metal material and the dielectric layer is provided over the $LiNbO_3$ substrate and the electrodes, and there is substantially no unevenness between electrode-bearing portions and electrode-free portions. Thus, the upper surface of the dielectric layer is flat or substantially flat and the insertion loss can be reduced. In addition, the material used to define the electrodes is preferably at least one of metal materials such as Al, Cu, Au, Ta, and Pt and the thickness of the electrodes, θ of the Euler angles of the $LiTaO_3$ substrate, and the thickness of the dielectric layer are within any of the ranges shown in Table 2. Therefore, an SH-type boundary acoustic wave can be non-leaky even if the electrodes have a reduced thickness. Thus, a boundary acoustic wave device which utilizes a SH-type boundary acoustic wave and which has low loss can be provided.

In particular, when the thickness of the electrodes, θ of the Euler angles, and the thickness of the dielectric layer are within any of the ranges shown in Table 4, the loss of the boundary acoustic wave device can be further reduced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
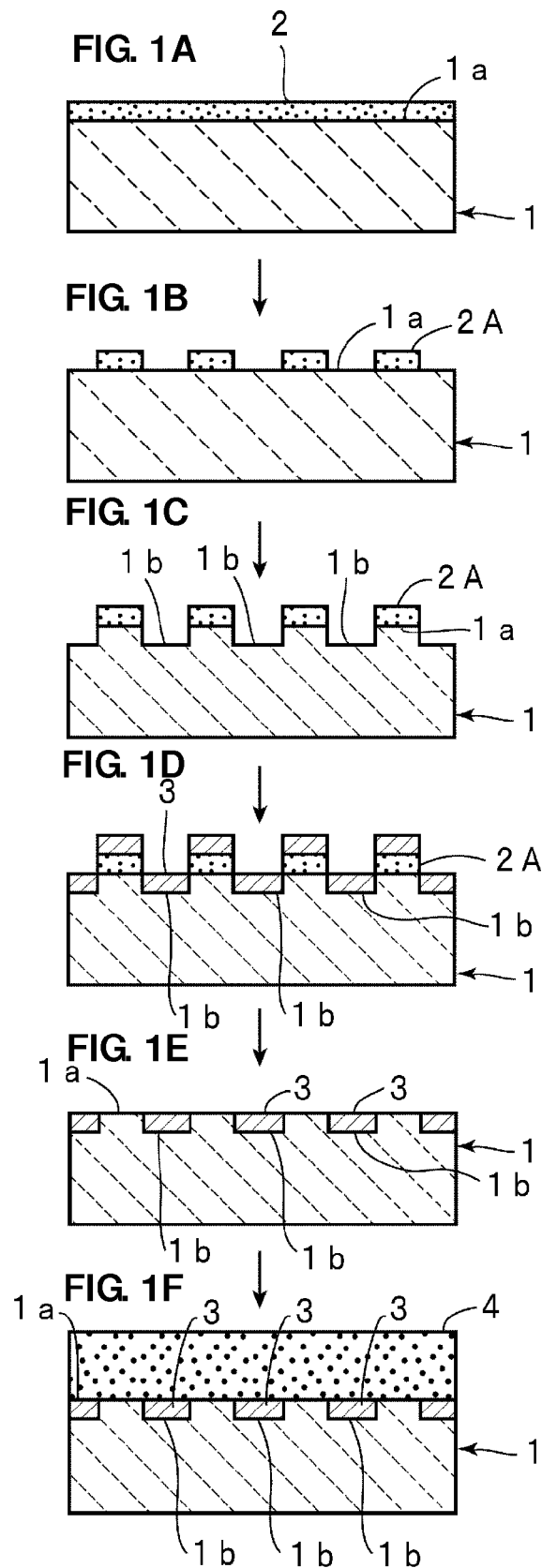
FIGS. 1A to 1F are front sectional views illustrating a method for manufacturing a boundary acoustic wave device according to a preferred embodiment the present invention and the structure of the boundary acoustic wave device.

Preferred embodiments of the present invention will be described below with reference to the accompanying drawings A method for manufacturing a boundary acoustic wave device according to a preferred embodiment of the present invention is described below with reference to FIGS. 1A to 1F.

As shown in FIGS. 1A and 1A, a LiNbO$_3$ substrate defining a piezoelectric substrate is prepared.

A photoresist layer 2 is formed over the upper surface 1a of the LiNbO$_3$ substrate 1. The photoresist layer 2 can preferably be formed from any photoresist material that is resistant to reactive ion etching (RIE) which is performed later. In this example, a positive resist, AZ-1500™, available from Clariant (Japan) K.K., for example, is preferably used. In this example, the thickness of the photoresist layer 2 is preferably about 2 μm.

The photoresist layer 2 is patterned such that the photoresist layer is exposed to light and then developed, whereby a photoresist pattern 2A is formed as shown in FIG. 1B. In the photoresist pattern 2A, portions provided to form IDT electrodes are removed from the photoresist layer.

As shown in FIG. 1C, a plurality of grooves 1b with a desired depth are preferably formed in the upper surface 1a of the LiNbO$_3$ substrate 1 by reactive ion etching, for example. The desired depth thereof is equal or substantially equal to the thickness of the IDT electrodes formed later. However, the etching depth may be slightly greater than or less than the thickness of the IDT electrodes.

Al layers are preferably formed by vapor deposition or sputtering, for example. This allows the Al layers defining electrode layers 3 to be disposed in the grooves 1b as shown in FIG. 1D. An Al layer is also disposed on the photoresist pattern 2A.

The LiNbO$_3$ substrate is immersed in a stripping solution preferably including acetone, for example, whereby the photoresist pattern 2A and the Al layer disposed on the photoresist pattern 2A are removed. This enables the grooves 1b to be filled with the electrode layers 3 and enables the LiNbO$_3$ substrate 1 to have a flat or substantially flat upper surface as shown in FIG. 1E.

As shown in FIG. 1F, a SiO$_2$ layer 4 defining a dielectric layer is formed on the upper surface, whereby the boundary acoustic wave device 5 is obtained. The SiO$_2$ layer 4 has a flat or substantially surface. This is because the upper surface 1a of the LiNbO$_3$ substrate 1 and the upper surface of each electrode layer 3 are substantially flush with each other and are flat or substantially flat. Therefore, the surface of the SiO$_2$ layer 4 can be securely planarized when the SiO$_2$ layer 4 is formed by a common process.

A process for forming the SiO$_2$ layer 4 is not particularly limited. The SiO$_2$ layer 4 may preferably be formed by an appropriate process such, as a printing process, a vapor deposition process, or a sputtering process, for example.

Figure 2:
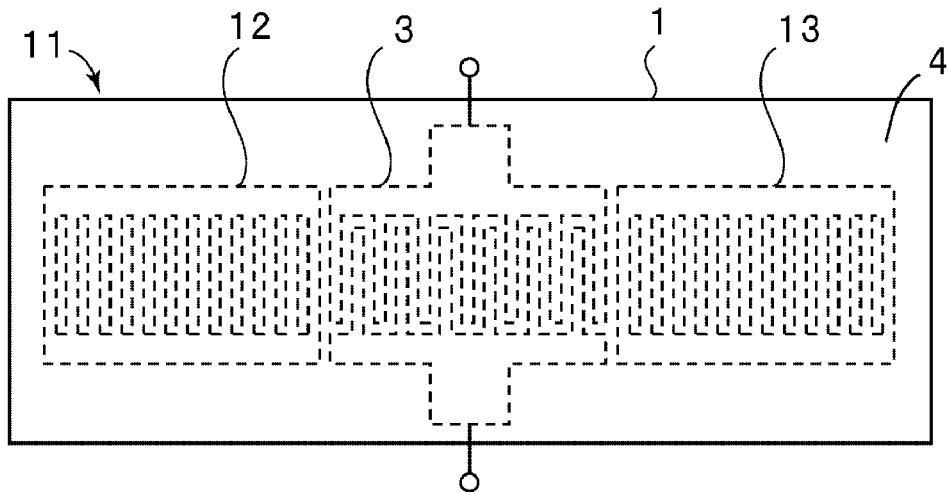
FIG. 2 is a schematic plan view of an electrode structure of the boundary acoustic wave device shown in FIG. 1.

The method for manufacturing the boundary acoustic wave device 5 of this preferred embodiment is as described above with reference to FIGS. 1A to 1F, which primarily illustrate the electrode portions. In particular, the electrode layers 3 preferably form an electrode structure including IDT electrodes. The electrode structure is not particularly limited and may preferably be a one port-type boundary acoustic wave resonator 11 shown in FIG. 2 in plan view, for example. In this case, the electrode layers form reflectors 12 and 13 arranged on both sides of the electrode layers 3 which form the IDT electrodes in the direction of a boundary acoustic wave propagation.

In this example, there is substantially no unevenness between electrode-bearing portions and electrode-free portions. Thus, the upper surface of the SiO$_2$ layer 4, which defines a dielectric layer, can be easily and effectively planarized and the insertion loss can be reduced.

The boundary acoustic wave device having low loss can be provided without increasing the thickness of the electrode layers 3. The electrode layers 3 are preferably made of a metal material that is at least one selected from the group consisting of Al, Ti, Ni, Cr, Cu, W, Ta, Pt, Ag, and Au, for example. Al and Ti are grouped into a first group, Ni and Cr are grouped into a second group, Cu, W, Ta, Pt, Ag, and Au are grouped into a third group, the thickness of the electrode layers made of the metal materials assigned to each group, θ of the Euler angles of the LiNbO$_3$ substrate 1, and the thickness of a dielectric layer are within any of the ranges shown in Table 5 below. Therefore, although the electrode layers have a relatively small thickness, the boundary acoustic wave device having low loss can be provided. This is described below in detail using examples.

"RF Filter using Boundary Acoustic Wave" (Proc. Symp. Ultrason. Electron., Vol. 26, pp. 25-26 (2005/11)) describes that the SH-type boundary acoustic wave is non-leaky in a SiO$_2$/electrodes/y-cut X-propagation LiNbO$_3$ multilayer structure when the electrodes are made of Al and have a thickness of at least 0.16λ or when the electrodes are made of Au, Cu, or Ag and have a thickness of at least 0.04λ.

However, experiments conducted by the inventors have shown that an SH-type boundary acoustic wave can be non-leaky in the boundary acoustic wave device 5 of this preferred embodiment although the electrode layers 3, which are defined by the metal material filled in the grooves 1b, have a smaller thickness. This is described below with reference to FIGS. 3 to 5.

Figure 3:
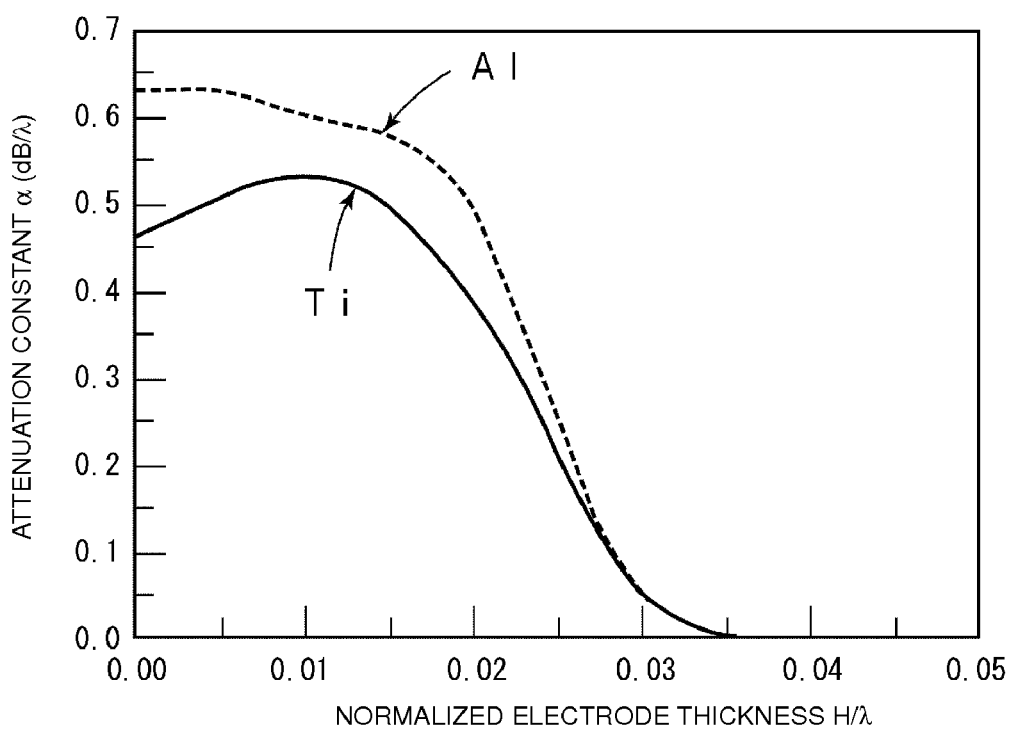
FIG. 3 is a graph showing the relationship between the normalized thickness H/λ of electrode layers formed by filling grooves, disposed in $LiNbO_3$ substrates which are included in boundary acoustic wave devices according to this preferred embodiment and which have Euler angles (0°, 103°, 0°), with Al or Ti and the attenuation constant α of the boundary acoustic wave devices.
Figure 4:
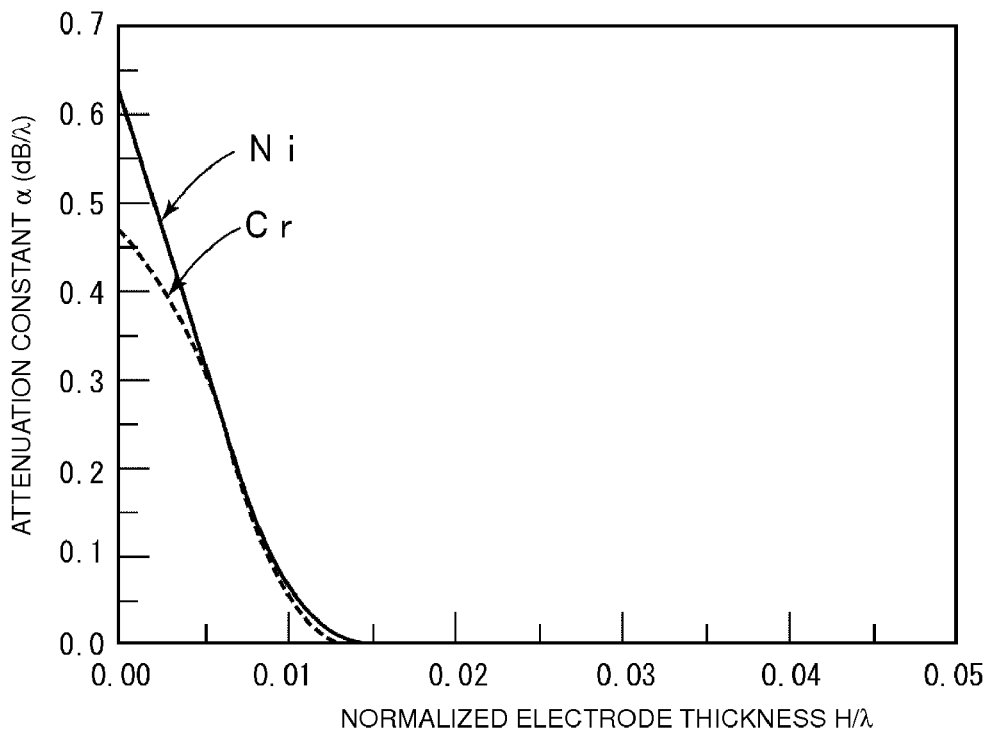
FIG. 4 is a graph showing the relationship between the normalized thickness H/λ of electrode layers formed by filling grooves, disposed in $LiNbO_3$ substrates which are included in boundary acoustic wave devices according to this preferred embodiment and which have Euler angles (0°, 103°, 0°), with Ni or Cr and the attenuation constant α of the boundary acoustic wave devices.
Figure 5:
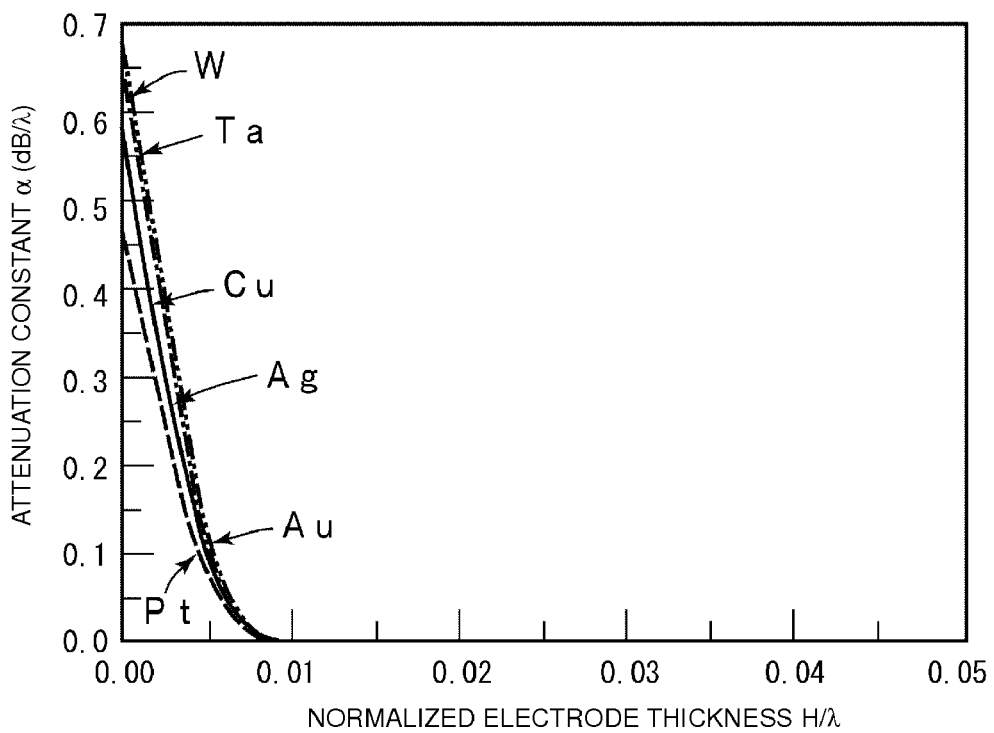
FIG. 5 is a graph showing the relationship between the normalized thickness H/λ of electrode layers formed by filling grooves, disposed in $LiNbO_3$ substrates which are included in boundary acoustic wave devices according to this preferred embodiment and which have Euler angles (0°, 103°, 0°), with each metal material of a third group and the attenuation constant α of the boundary acoustic wave devices.

FIG. 3 is a graph showing the relationship between the thickness of electrode layers 3 made of the metal materials of the first group and the attenuation constant α of boundary acoustic wave devices 5 including LiNbO$_3$ substrates with Euler angles (0°, 103°, 0°). FIG. 4 is a graph showing the relationship between the thickness of electrode layers 3 made of the metal materials of the second group and the attenuation constant α of boundary acoustic wave devices 5. FIG. 5 is a graph showing the relationship between the thickness of electrode layers 3 made of the metal materials of the third group and the attenuation constant α of boundary acoustic wave devices 5. The electrode layers 3 have an electrode structure for forming the one port-type boundary acoustic wave resonator shown in FIG. 3.

FIGS. 3 to 5 illustrate that the following combination is within ranges specified in Tables 6 to 11: a combination of the thickness of the electrode layers that are made of the corresponding metal materials of the first to third groups such that the propagation loss α is about 0.1 dB/λ or less or substantially zero, θ of Euler angles, and a SiO$_2$ layer.

TABLE 6

| α ≦ 0.1 | | |
|---|---|---|
| Al, Ti | θ (degrees) | SiO$_2$ |
| 0.04 to 0.07 | 79 to 106 | 0.8 to 2.5 |
| 0.07 to 0.1 | 66 to 116 | 0.8 to 2.5 |
| 0.1 to 0.2 | 56 to 125 | 0.8 to 2.5 |

TABLE 5

α ≦ 0
θ of Euler angles (0°, θ, −45° to 45°)

| | | |
|---|---|---|
| 0.04 ≦ Thickness of first group electrode < 0.07 | (0, 76 to 106, −45 to 45) | 0.8 ≦ Thickness of dielectric layer ≦ 2.5 |
| 0.07 ≦ Thickness of first group electrode < 0.1 | (0, 66 to 116, −45 to 45) | 0.8 ≦ Thickness of dielectric layer ≦ 2.5 |
| 0.1 ≦ Thickness of first group electrode ≦ 0.2 | (0, 56 to 125, −45 to 45) | 0.8 ≦ Thickness of dielectric layer ≦ 2.5 |
| 0.01 ≦ Thickness of second group electrode < 0.02 | (0, 71 to 101, −45 to 45) | 0.8 ≦ Thickness of dielectric layer ≦ 3.0 |
| 0.02 ≦ Thickness of second group electrode < 0.06 | (0, 68 to 103, −45 to 45) | 0.8 ≦ Thickness of dielectric layer ≦ 3.0 |
| 0.06 ≦ Thickness of second group electrode < 0.08 | (0, 66 to 109, −45 to 45) | 0.8 ≦ Thickness of dielectric layer ≦ 3.0 |
| 0.08 ≦ Thickness of second group electrode ≦ 0.16 | (0, 61 to 123, −45 to 45) | 0.8 ≦ Thickness of dielectric layer ≦ 3.0 |
| 0.01 ≦ Thickness of third group electrode < 0.02 | (0, 61 to 112, −45 to 45) | 0.8 ≦ Thickness of dielectric layer ≦ 4.0 |
| 0.02 ≦ Thickness of third group electrode < 0.06 | (0, 60 to 122, −45 to 45) | 0.8 ≦ Thickness of dielectric layer ≦ 4.0 |
| 0.06 ≦ Thickness of third group electrode < 0.08 | (0, 56 to 132, −45 to 45) | 0.8 ≦ Thickness of dielectric layer ≦ 4.0 |
| 0.08 ≦ Thickness of third group electrode ≦ 0.10 | (0, 51 to 136, −45 to 45) | 0.8 ≦ Thickness of dielectric layer ≦ 4.0 |

The thickness of each electrode and the thickness of a dielectric layer are normalized thickness H/λ (λ is the wavelength of a boundary acoustic wave).

TABLE 7

| Al, Ti | θ (degrees) | SiO₂ |
|---|---|---|
| α ≈ 0 | | |
| 0.04 to 0.07 | 88 to 93 | 0.8 to 2.5 |
| 0.07 to 0.1 | 78 to 111 | 0.8 to 2.5 |
| 0.1 to 0.2 | 78 to 112 | 0.8 to 2.5 |

TABLE 8

| Ni, Cr | θ (degrees) | SiO₂ |
|---|---|---|
| α ≤ 0.1 | | |
| 0.01 to 0.02 | 71 to 101 | 0.8 to 3.0 |
| 0.02 to 0.06 | 68 to 103 | 0.8 to 3.0 |
| 0.06 to 0.08 | 66 to 109 | 0.8 to 3.0 |
| 0.08 to 0.16 | 61 to 123 | 0.8 to 3.0 |

TABLE 9

| Ni, Cr | θ (degrees) | SiO₂ |
|---|---|---|
| α ≈ 0 | | |
| 0.01 to 0.02 | 79 to 87 | 0.8 to 3.0 |
| 0.02 to 0.06 | 79 to 89 | 0.8 to 3.0 |
| 0.06 to 0.08 | 79 to 90 | 0.8 to 3.0 |
| 0.08 to 0.16 | 79 to 90 | 0.8 to 3.0 |

TABLE 10

| Cu, W, Ta, Pt, Ag, Au | θ (degrees) | SiO₂ |
|---|---|---|
| α ≤ 0.1 | | |
| 0.01 to 0.02 | 61 to 112 | 0.8 to 4.0 |
| 0.02 to 0.06 | 60 to 122 | 0.8 to 4.0 |
| 0.06 to 0.08 | 56 to 132 | 0.8 to 4.0 |
| 0.08 to 0.10 | 51 to 136 | 0.8 to 4.0 |

TABLE 11

| Cu, W, Ta, Pt, Ag, Au | θ (degrees) | SiO₂ |
|---|---|---|
| α ≈ 0 | | |
| 0.01 to 0.02 | 68 to 103 | 0.8 to 4.0 |
| 0.02 to 0.06 | 68 to 113 | 0.8 to 4.0 |
| 0.06 to 0.08 | 68 to 126 | 0.8 to 4.0 |
| 0.08 to 0.10 | 68 to 140 | 0.8 to 4.0 |

As shown in FIGS. 3 to 5, since the electrode layers 3 are defined by the metal material filled in the grooves 1b, the attenuation constant α of an SH-type boundary acoustic wave is about 0.1 dB/λ or less and therefore the SH-type boundary acoustic wave is non-leaky when the electrode layers 3 are made of Al or Ti and have a thickness of at least about 0.03λ; when the IDT electrodes are made of one of the metal materials of the second group, that is, Ni or Cr, and have a thickness of at least about 0.01λ; or when the IDT electrodes are made of one of the metal materials of the third group, that is, Cu, W, Ta, Pt, Ag, or Au and have a thickness of at least about 0.005λ.

Figure 6:
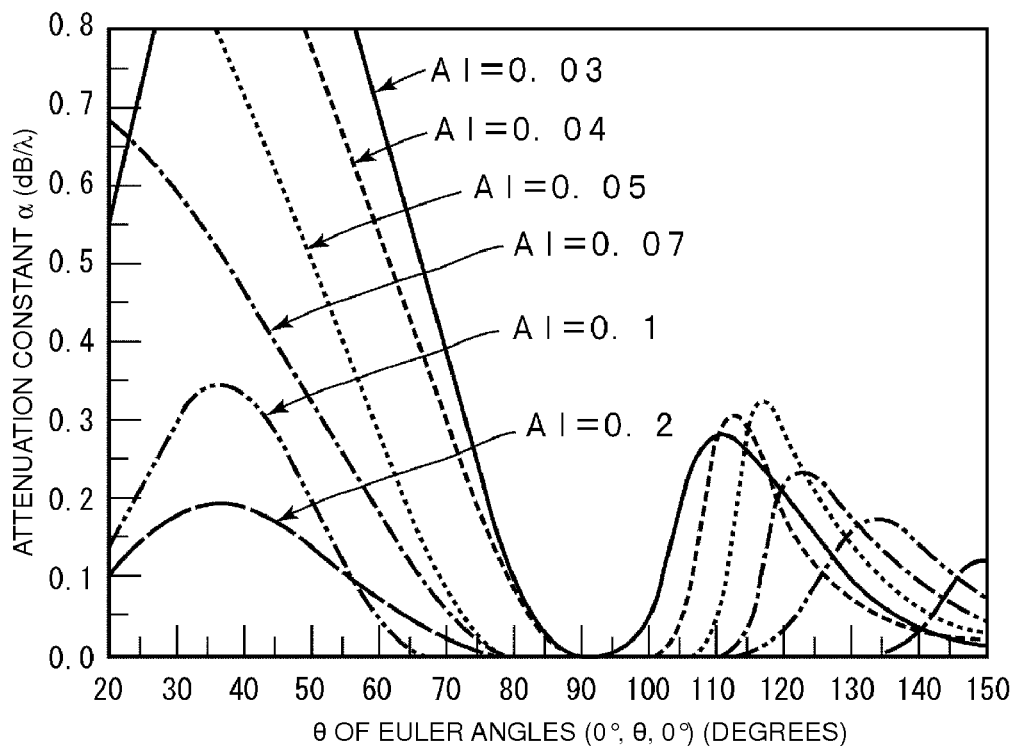
FIG. 6 is a graph showing the relationship between θ of the Euler angles of $LiNbO_3$ substrates and the attenuation constant α of electrodes which are made of Al and which are varied in normalized thickness.
Figure 7:
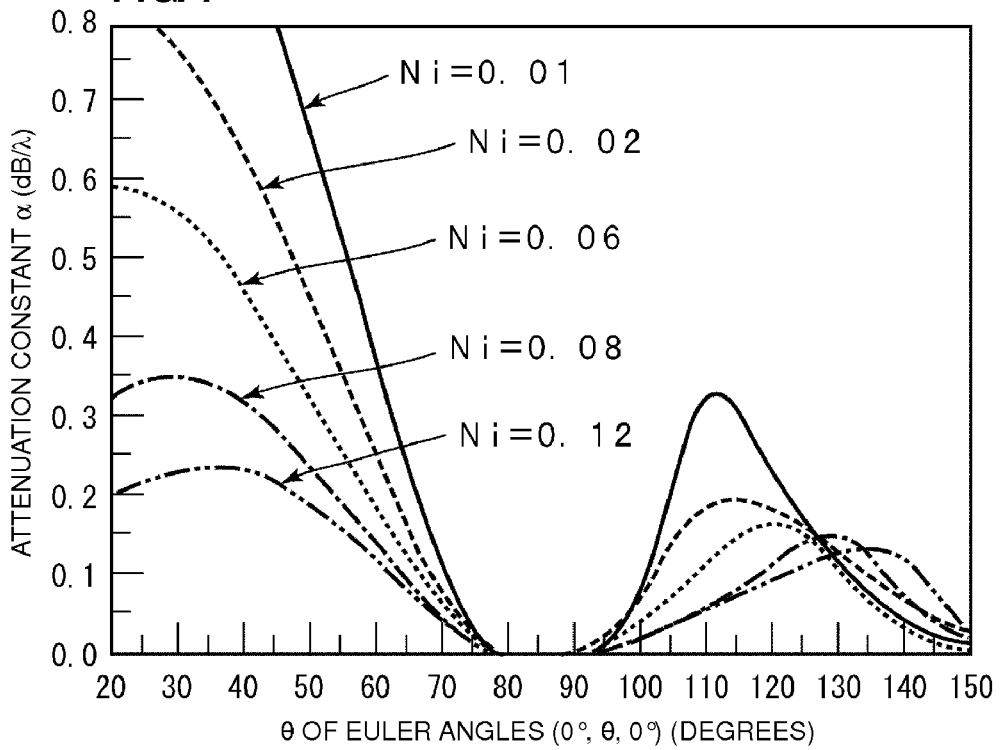
FIG. 7 is a graph showing the relationship between θ of the Euler angles of LiNbO$_3$ substrates and the attenuation constant α of electrodes which are made of Ni and which are varied in normalized thickness.
Figure 8:
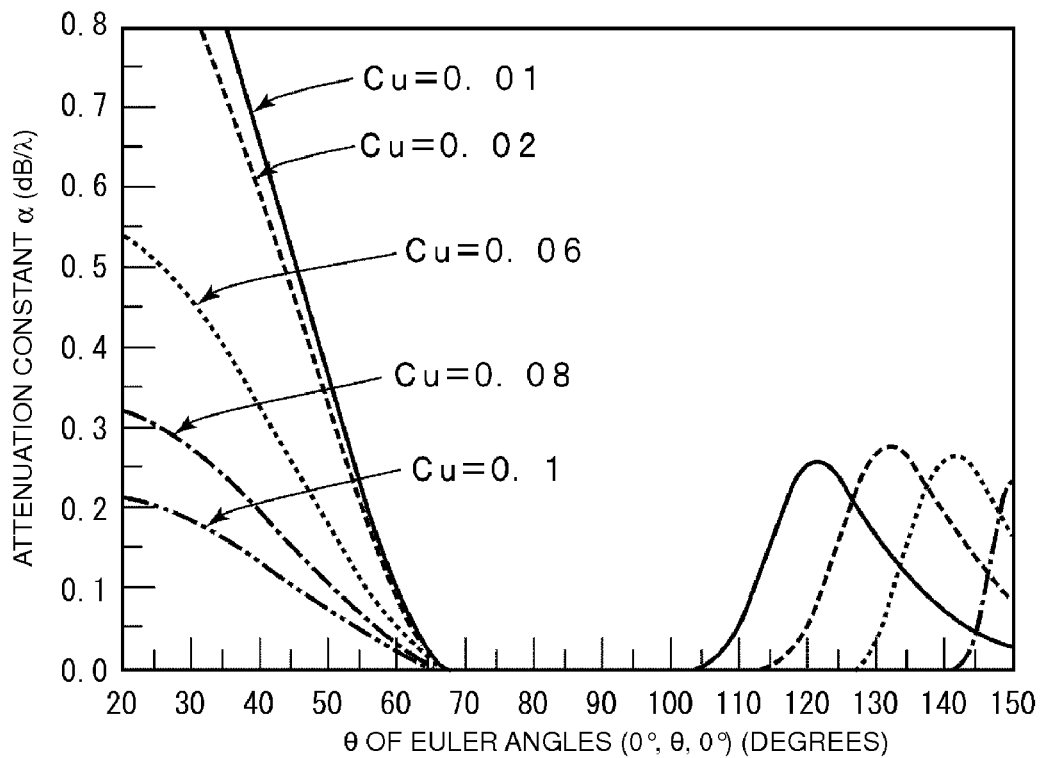
FIG. 8 is a graph showing the relationship between θ of the Euler angles of LiNbO$_3$ substrates and the attenuation constant α of electrodes which are made of Cu and which are varied in normalized thickness.

In the boundary acoustic wave devices 5, θ of the Euler angles (0°, θ, 0°) of each LiNbO₃ substrate is varied and IDT electrodes are made of the corresponding metal materials of the first to third groups. FIGS. 6 to 8 each show the relationship between θ of the Euler angles and the attenuation constant α.

As shown in FIGS. 6 to 8, the attenuation constant α is very small and therefore a boundary acoustic wave is non-leaky in a specific range when the IDT electrodes are made of the corresponding metal materials of the first to third groups and θ of the Euler angles and the thickness of the electrodes are varied.

Figure 9:
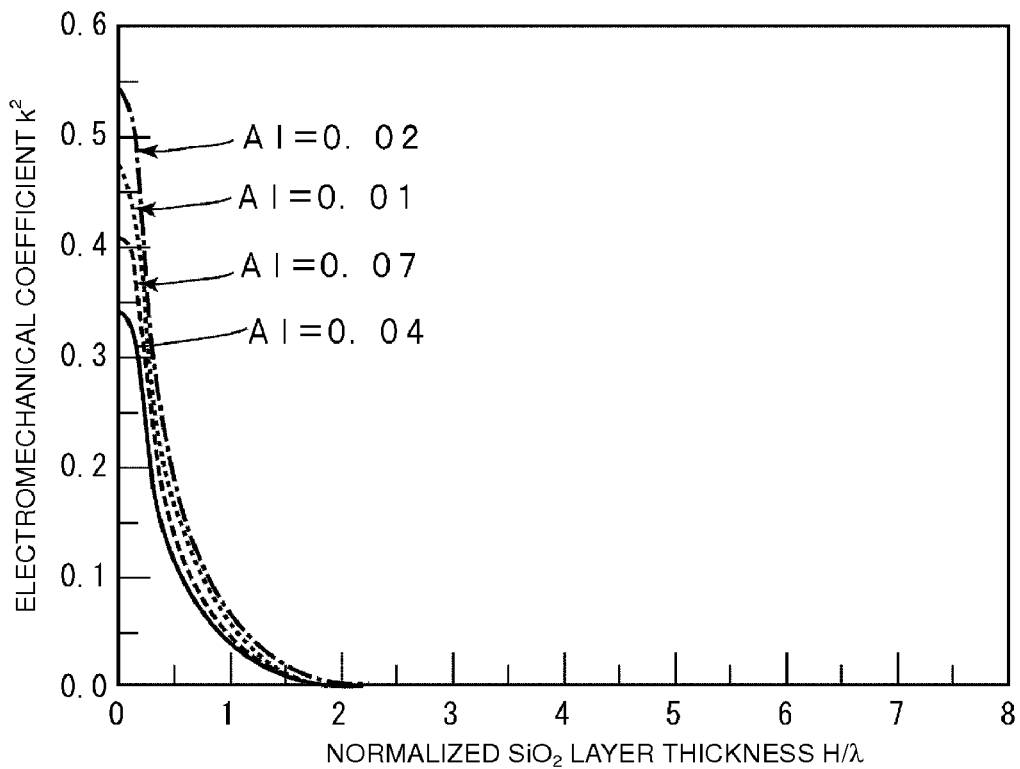
FIG. 9 is a graph showing the variation in electromechanical coefficient k$^2$ with the thickness of electrodes made of Al and the thickness of SiO$_2$ layers, the electrodes being IDT electrodes formed in grooves disposed in LiNbO$_3$ substrates with Euler angles (0°, 103°, 0°) using Al, the SiO$_2$ layers being deposited on the electrodes.
Figure 10:
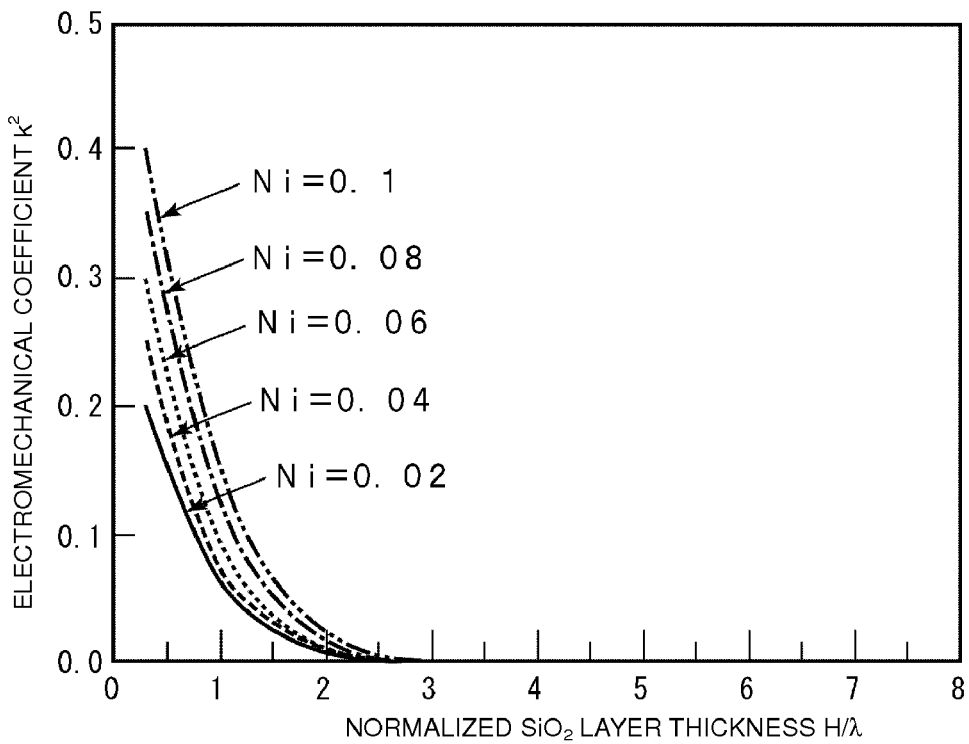
FIG. 10 is a graph showing the variation in electromechanical coefficient k$^2$ with the thickness of electrodes made of Ni and the thickness of SiO$_2$ layers, the electrodes being IDT electrodes formed in grooves disposed in LiNbO$_3$ substrates with Euler angles (0°, 103°, 0°) using Ni, the SiO$_2$ layers being deposited on the electrodes.
Figure 11:
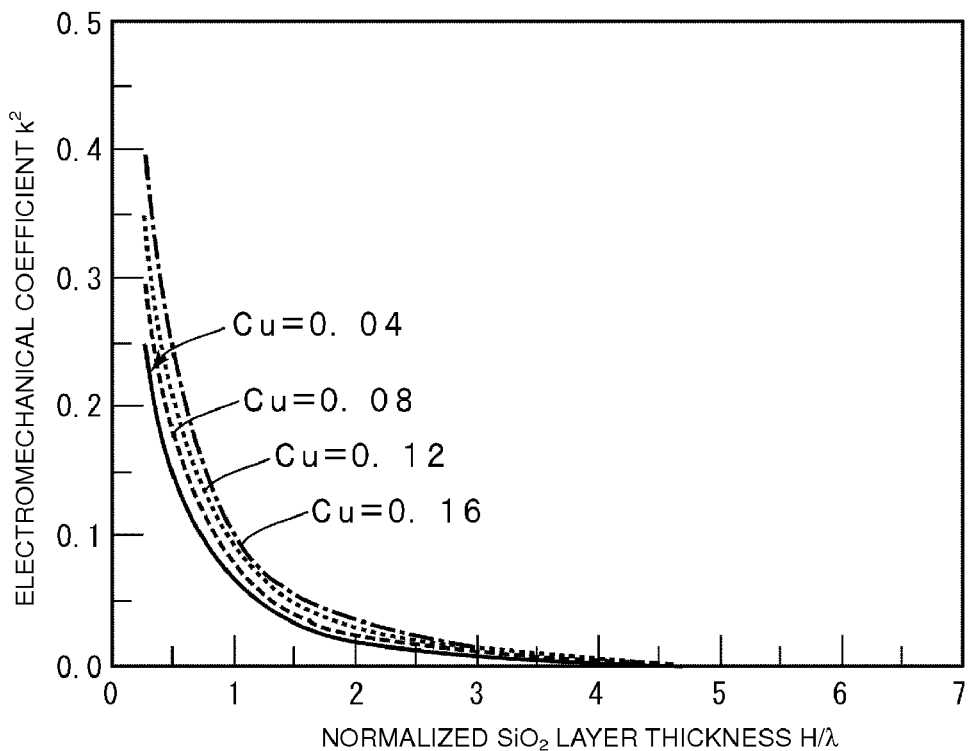
FIG. 11 is a graph showing the variation in electromechanical coefficient k$^2$ with the thickness of electrodes made of Cu and the thickness of SiO$_2$ layers, the electrodes being IDT electrodes formed in grooves disposed in LiNbO$_3$ substrates with Euler angles (0°, 103°, 0°) using Cu, the SiO$_2$ layers being deposited on the electrodes.

In the boundary acoustic wave devices 5, dielectric layers defined by SiO₂ layers 4. The following relationship was determined using LiNbO₃ substrates with Euler angles (0°, 103°, 0°): the relationship between the normalized thickness H/λ of the dielectric layers defined by the SiO₂ layers 4 and the electromechanical coefficient k² of SH-type normalization. The results are shown in FIGS. 9 to 11. As shown in FIGS. 9 to 11, an increase in the thickness of the SiO₂ layer 4 tends to reduce the electromechanical coefficient k² of an SH-type boundary acoustic wave. Since the magnitude of the electromechanical coefficient k² may be selected depending upon the application, the thickness of the dielectric layers defined by the SiO₂ layers 4 may be selected within ranges shown in FIGS. 9 to 11 depending on a range required for the electromechanical coefficient k² of the SH-type boundary acoustic wave.

The results of electrode layers 3 made of Al, Ni, and Cu are shown in FIGS. 9 to 11. It was confirmed that Ti shows substantially the same value as that of Al; Cr shows substantially the same value as that of Ni; and Cu, W, Ta, Pt, or Ag shows a value close to that of Au.

Figure 12:
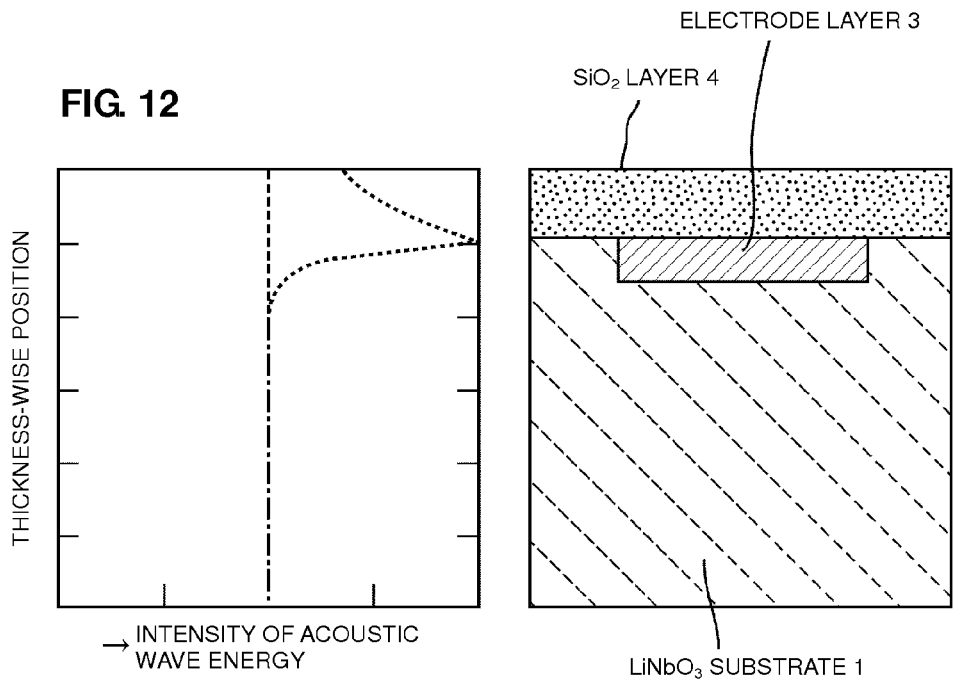
FIG. 12 is a schematic view illustrating the energy distribution of an acoustic wave propagating in a SiO$_2$/embedded IDT electrode/LiNbO$_3$ multilayer structure including a SiO$_2$ layer with a normalized thickness H/λ of less than about 0.8.
Figure 13:
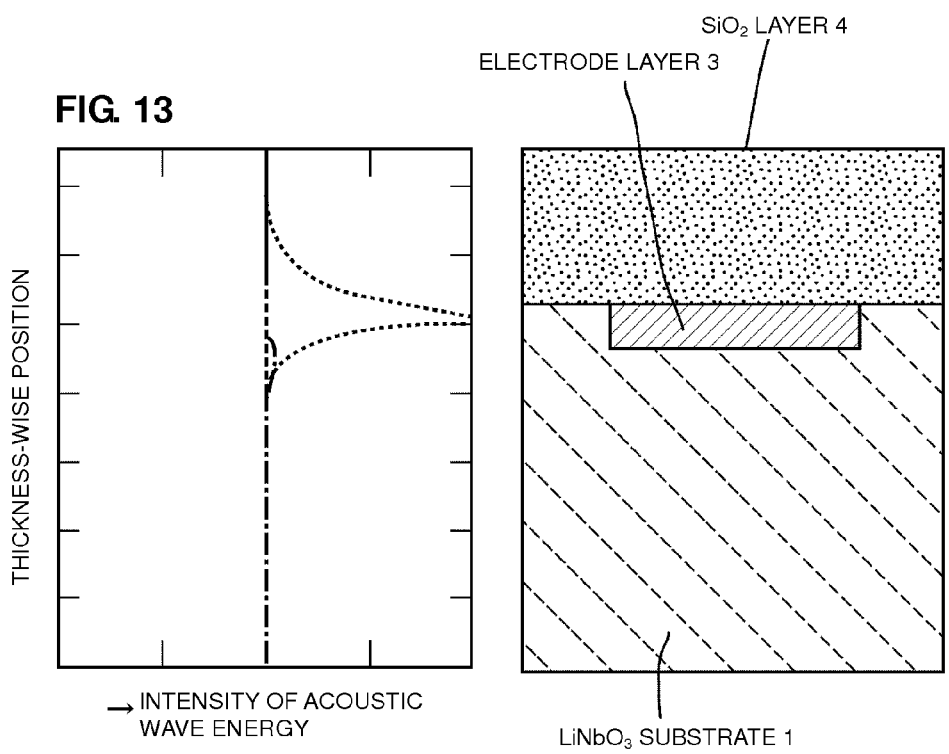
FIG. 13 is a schematic view illustrating the energy distribution of an acoustic wave propagating in a SiO$_2$/embedded IDT electrode/LiNbO$_3$ multilayer structure including a SiO$_2$ layer with a normalized thickness H/λ of at least about 0.8.

FIGS. 12 and 13 are schematic views each illustrating the energy distribution of an acoustic wave propagating in a structure including an IDT electrode disposed in a groove 1b provided in a LiNbO₃ substrate 1 and a SiO₂ layer 4 provided over the IDT electrode, the SiO₂ layer 4 defining a dielectric layer of which normalized thicknesses H/λ are less than about 0.8 and about 0.8 or more, respectively.

As shown in FIG. 12, the energy of the acoustic wave is distributed over the upper surface of the dielectric layer defined by the SiO₂ layer 4, which has a normalized thickness H/λ of less than about 0.8. Thus, the structure cannot be used as a boundary acoustic wave device. In contrast, the SiO₂ layer 4 shown in FIG. 13 has a normalized thickness H/λ of at least about 0.8 and therefore the energy of the acoustic wave is confined in this structure. Thus, this structure can be used as a boundary acoustic wave device.

The results shown in FIGS. 3 to 5, 6 to 8, 9 to 11, 12, and 13 show that the following relationship may be within any of the ranges shown in Table 5: the relationship between the type of material most suitable for the electrodes used for boundary acoustic waves, the normalized thickness H/λ of each electrode, the normalized thickness of a dielectric layer made of SiO₂, and θ of the Euler angles. In Table 5, Euler angles are expressed in the form of (0°, θ, −45° to +45°), that is, ψ ranges from about −45° to 45°, although ψ=0 in the above experiment. This is because if θ of the Euler angles of a LiNbO₃ substrate is within a specific range, a small propagation loss is obtained as described above when ψ is about 0° or is within the range of about −45° to about 45°. Not only in LiNbO₃ but also in LiTaO₃ used in a second experiment below, ψ of Euler angles (0°, θ, ψ) shows substantially the same results as those achieved when ψ=0°, if ψ is within the range of about −45° to about 45°.

When any of the ranges shown in Table 12 below is satisfied, propagation loss can be further reduced.

TABLE 12

$\alpha = 0$
θ of Euler angles (0°, θ, −45° to 45°)

| | | |
|---|---|---|
| $0.04 \leq$ Thickness of first group electrode $< 0.07$ | (0, 88 to 93, −45 to 45) | $0.8 \leq$ Thickness of dielectric layer $\leq 2.5$ |
| $0.07 \leq$ Thickness of first group electrode $< 0.01$ | (0, 78 to 111, −45 to 45) | $0.8 \leq$ Thickness of dielectric layer $\leq 2.5$ |
| $0.1 \leq$ Thickness of first group electrode $\leq 0.02$ | (0, 78 to 112, −45 to 45) | $0.8 \leq$ Thickness of dielectric layer $\leq 2.5$ |
| $0.01 \leq$ Thickness of second group electrode $< 0.02$ | (0, 79 to 87, −45 to 45) | $0.8 \leq$ Thickness of dielectric layer $\leq 3.0$ |
| $0.02 \leq$ Thickness of second group electrode $< 0.06$ | (0, 79 to 89, −45 to 45) | $0.8 \leq$ Thickness of dielectric layer $\leq 3.0$ |
| $0.06 \leq$ Thickness of second group electrode $< 0.08$ | (0, 79 to 90, −45 to 45) | $0.8 \leq$ Thickness of dielectric layer $\leq 3.0$ |
| $0.08 \leq$ Thickness of second group electrode $\leq 0.16$ | (0, 79 to 90, −45 to 45) | $0.8 \leq$ Thickness of dielectric layer $\leq 3.0$ |
| $0.01 \leq$ Thickness of third group electrode $< 0.02$ | (0, 68 to 103, −45 to 45) | $0.8 \leq$ Thickness of dielectric layer $\leq 4.0$ |
| $0.02 \leq$ Thickness of third group electrode $< 0.06$ | (0, 68 to 113, −45 to 45) | $0.8 \leq$ Thickness of dielectric layer $\leq 4.0$ |
| $0.06 \leq$ Thickness of third group electrode $< 0.08$ | (0, 68 to 126, −45 to 45) | $0.8 \leq$ Thickness of dielectric layer $\leq 4.0$ |
| $0.08 \leq$ Thickness of third group electrode $\leq 0.10$ | (0, 68 to 140, −45 to 45) | $0.8 \leq$ Thickness of dielectric layer $\leq 4.0$ |

The thickness of each electrode and the thickness of a dielectric layer are normalized thickness H/λ (λ is the wavelength of a boundary acoustic wave).

Figure 14:
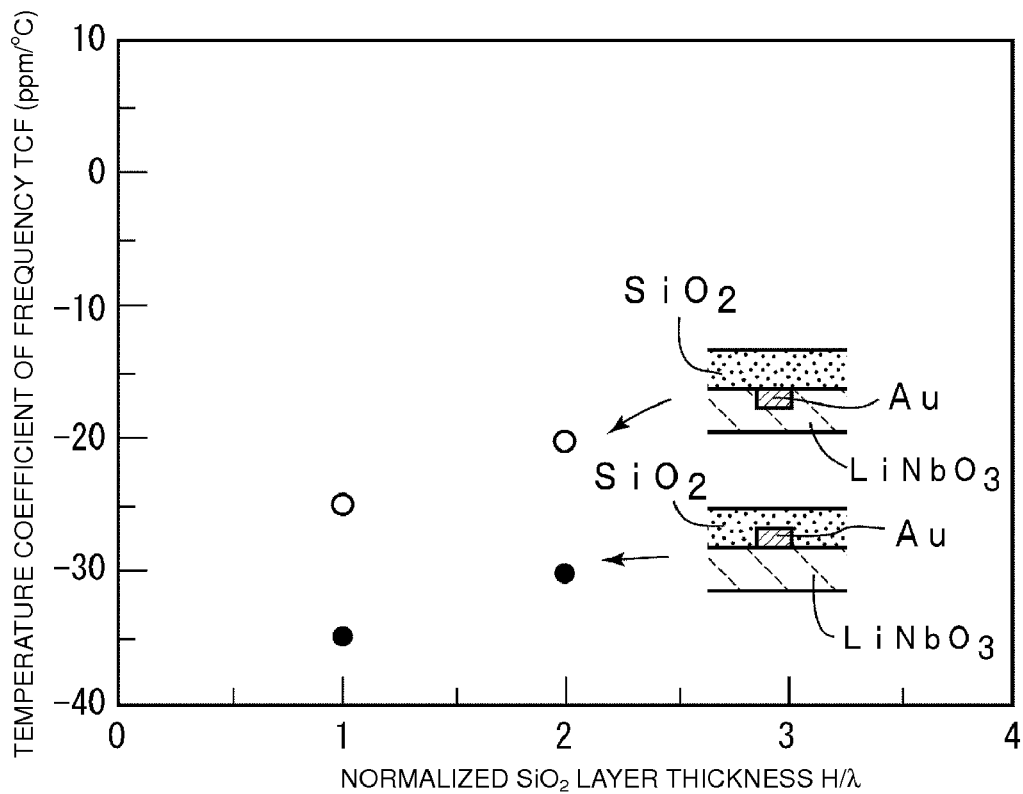
FIG. 14 is a graph showing the temperature coefficient of frequency TCF of a boundary acoustic wave device according to a first preferred embodiment of the present invention and the temperature coefficient of frequency TCF of a boundary acoustic wave device of a comparative example that includes IDT electrodes which are not embedded, the boundary acoustic wave device according to the first preferred embodiment and the boundary acoustic wave device of the comparative example including SiO$_2$ layers with a thickness of about 1λ or about 2λ.

In the boundary acoustic wave device 5 of this preferred embodiment, the electrode layers 3 including IDT electrodes are formed by filling the grooves 1b, disposed in the upper surface of the LiNbO₃ substrate 1, with the metal material. According to this structure, the absolute value of a temperature coefficient of frequency TCF can be reduced and frequency-temperature characteristic can be improved as compared to those of comparative examples in which IDT electrodes are formed on LiNbO₃ substrates without filling grooves with any metal material. This is shown in FIG. 14. FIG. 14 shows the temperature coefficient of frequency TCF of the boundary acoustic wave device of this preferred embodiment, the boundary acoustic wave device being obtained such that the grooves are formed in the LiNbO₃ substrate with Euler angles (0°, 103°, 0°), the IDT electrodes with a thickness of about 0.04λ are formed by filling the grooves with Au, and the SiO₂ layer with a thickness of about 1λ or about 2λ is deposited over the IDT electrodes. For comparison, FIG. 14 also shows the temperature coefficient of frequency TCF of a boundary acoustic wave device which is obtained such that IDT electrodes made of Au having the same or substantially the same thickness are formed on a LiNbO₃ substrate without forming any grooves and a SiO₂ layer having the thickness of about 1λ or about 2λ similar to the above-described preferred embodiment.

As shown in FIG. 14, according to the preferred embodiment, the absolute value of the thermal coefficient of frequency TCF can be reduced and can be improved by about 5 ppm/° C. as compared to comparative examples regardless of whether the normalized thickness H/λ of a dielectric layer made of SiO₂ is about 1λ or about 2λ.

In this preferred embodiment, the dielectric layer is preferably defined by the SiO₂ layer 4, for example, but may preferably be made of silicon oxide other than SiO₂.

Although the LiNbO₃ substrates were preferably used in the preferred embodiments described above, LiTaO₃ substrates are used in the preferred embodiments described below. A plurality of grooves 1b were formed in the upper surfaces of the LiTaO₃ substrates in the same or substantially the same manner as that described with reference to FIG. 1, electrode layers 3 were formed by filling the grooves 1b with various metal materials, and SiO₂ layers defining dielectric layers were deposited. FIGS. 15 to 19 are graphs illustrating the relationship between θ of the Euler angles (0°, θ, 0°) of the LiTaO₃ substrates, which are disposed in boundary acoustic wave devices obtained as described above, the thickness of the electrode layers, and the attenuation constant α of the boundary acoustic wave devices.

Figure 15:
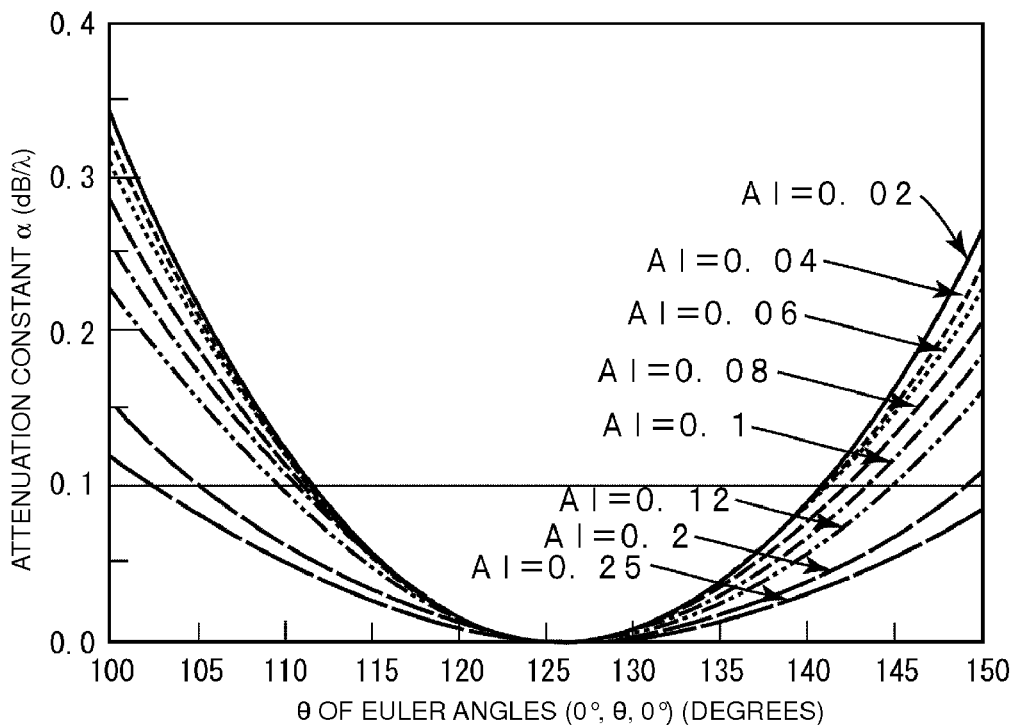
FIG. 15 is a graph illustrating the relationship between θ of the Euler angles (0°, θ, 0°) of LiTaO$_3$ substrates, the thickness of IDT electrodes made of Al, and the attenuation constant α of boundary acoustic wave devices.
Figure 16:
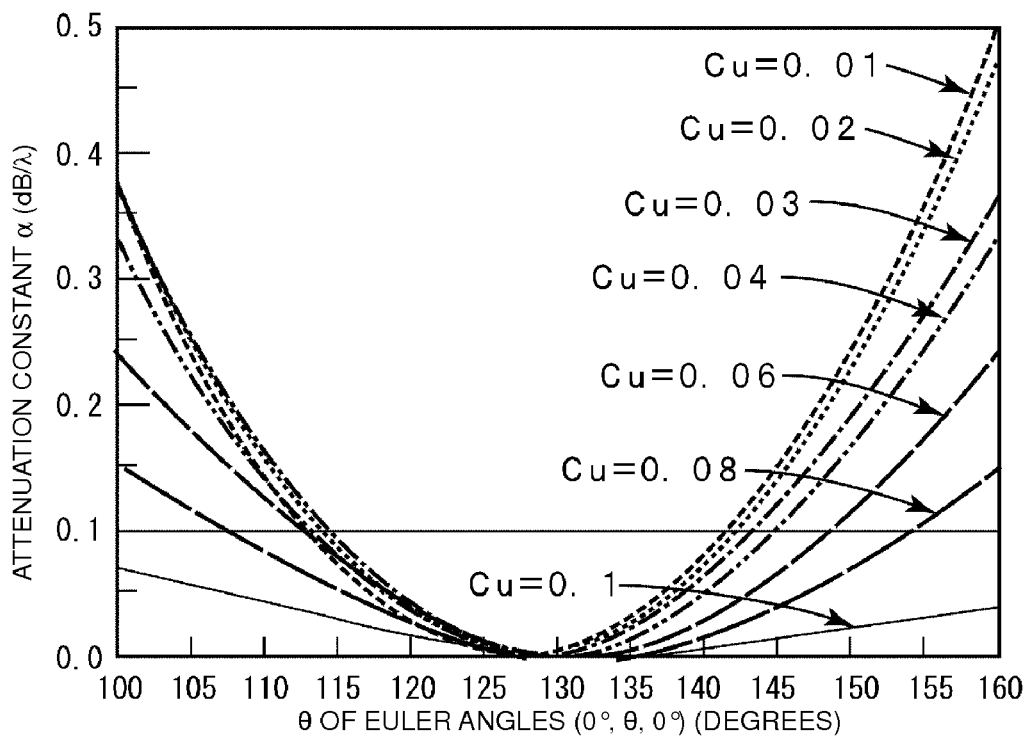
FIG. 16 is a graph illustrating the relationship between θ of the Euler angles (0°, θ, 0°) of LiTaO$_3$ substrates, the thickness of IDT electrodes made of Cu, and the attenuation constant α of boundary acoustic wave devices.
Figure 17:
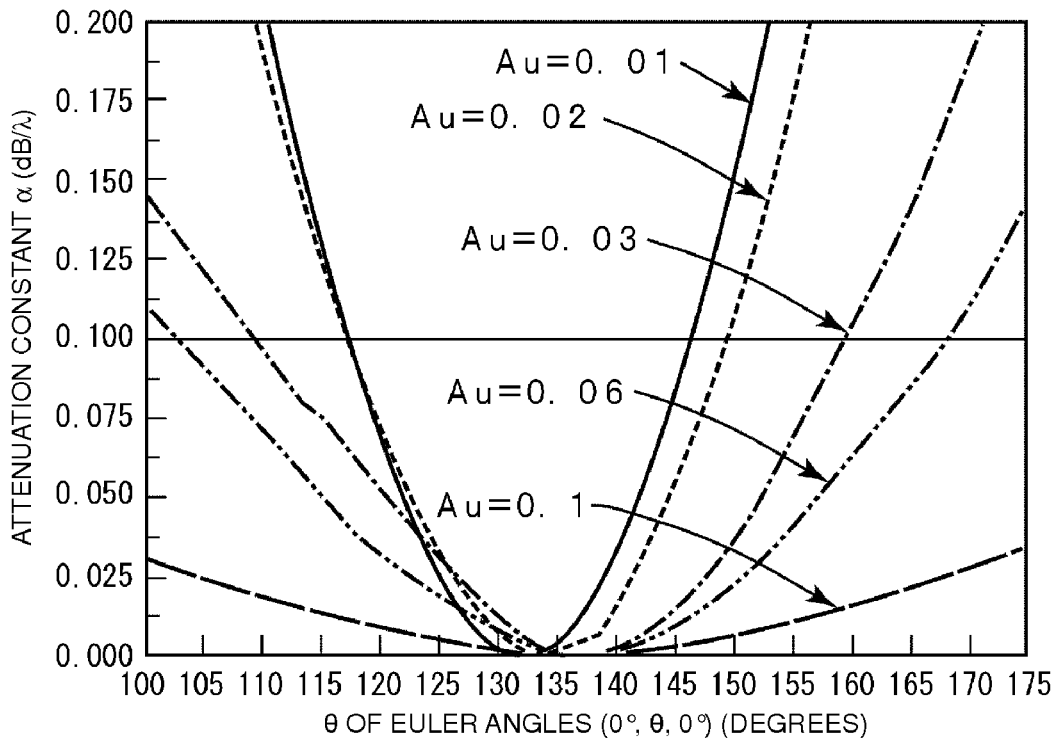
FIG. 17 is a graph illustrating the relationship between θ of the Euler angles (0°, θ, 0°) of LiTaO$_3$ substrates, the thickness of IDT electrodes made of Au, and the attenuation constant α of boundary acoustic wave devices.
Figure 18:
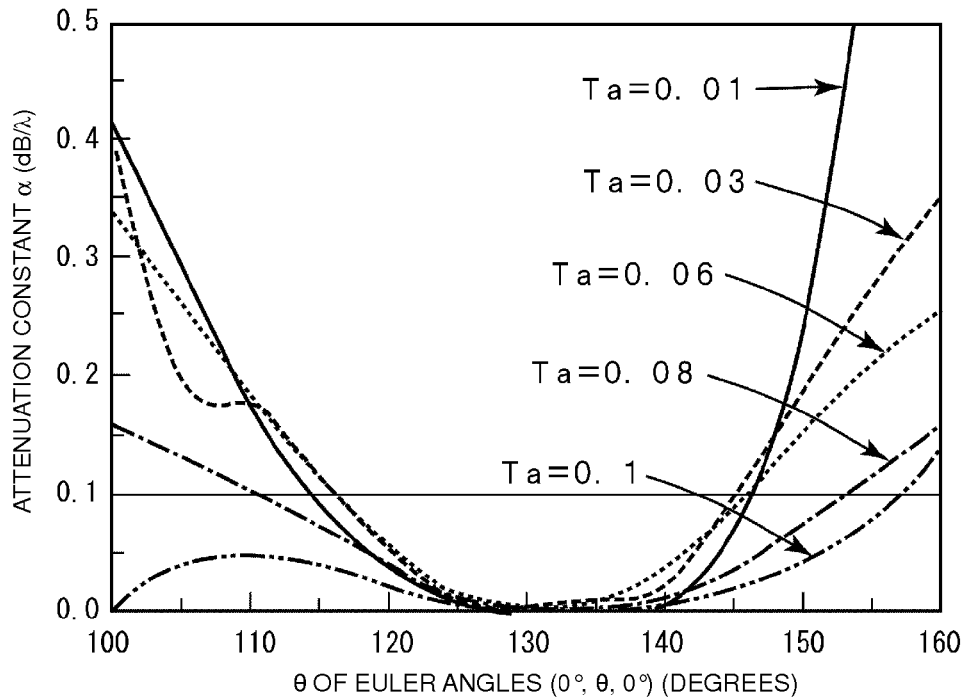
FIG. 18 is a graph illustrating the relationship between θ of the Euler angles (0°, θ, 0°) of LiTaO$_3$ substrates, the thickness of IDT electrodes made of Ta, and the attenuation constant α of boundary acoustic wave devices.
Figure 19:
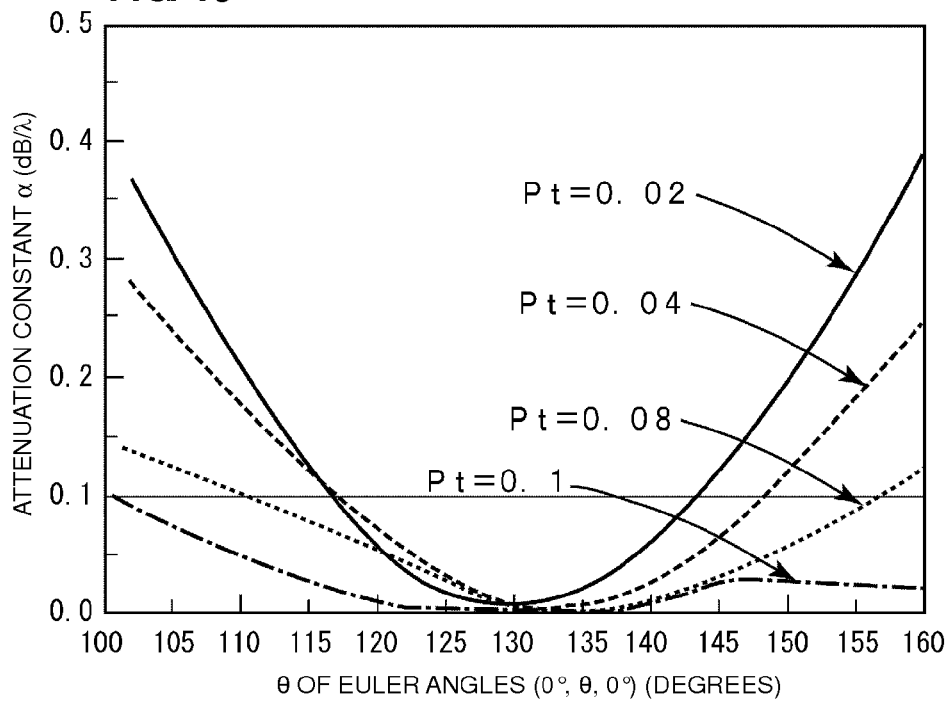
FIG. 19 is a graph illustrating the relationship between θ of the Euler angles (0°, θ, 0°) of LiTaO$_3$ substrates, the thickness of IDT electrodes made of Pt, and the attenuation constant α of boundary acoustic wave devices.
Figure 20:
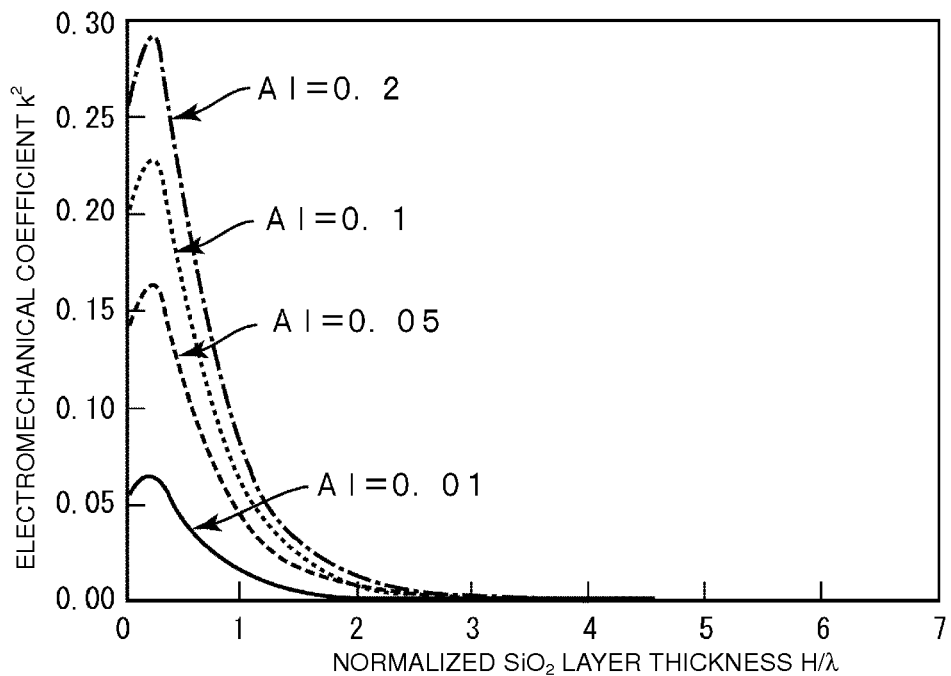
FIG. 20 is a graph showing the relationship between the normalized thickness H/λ of SiO$_2$ layers, the normalized thickness of Al layers, and the electromechanical coefficient k$^2$ of structures in which embedded electrodes made of Al are provided in LiTaO$_3$ with Euler angles (0°, 126°, 0°) and SiO$_2$ is provided on the electrodes.
Figure 21:
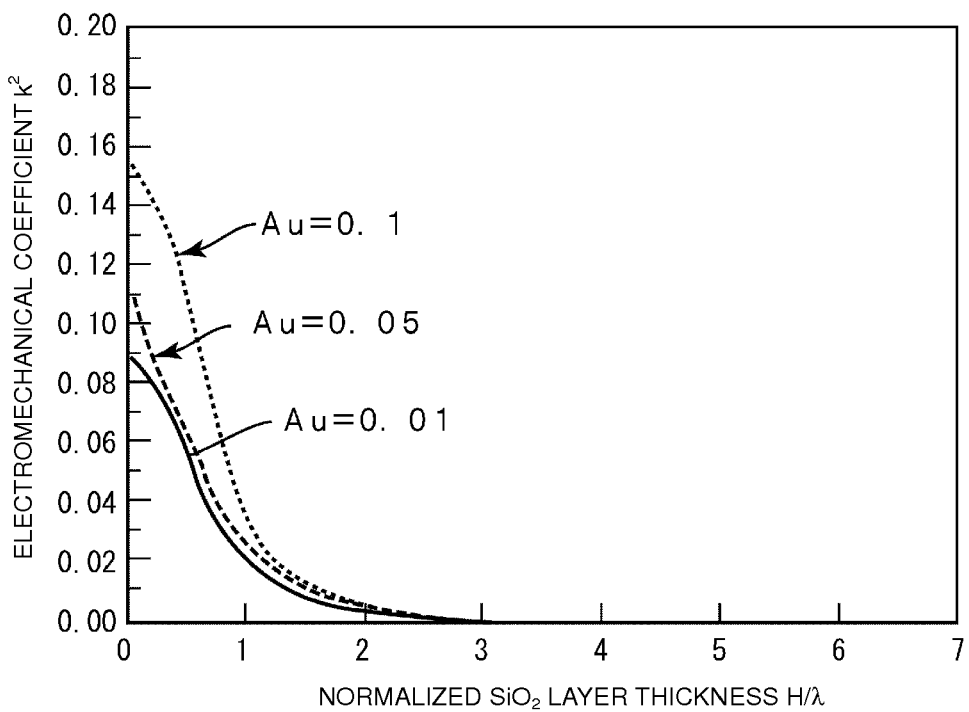
FIG. 21 is a graph showing the relationship between the normalized thickness H/λ of SiO$_2$ layers, the normalized thickness of Au layers, and the electromechanical coefficient k$^2$ of structures in which embedded electrodes made of Au are provided in LiTaO$_3$ with Euler angles (0°, 126°, 0°) and SiO$_2$ is provided on the electrodes.
Figure 22:
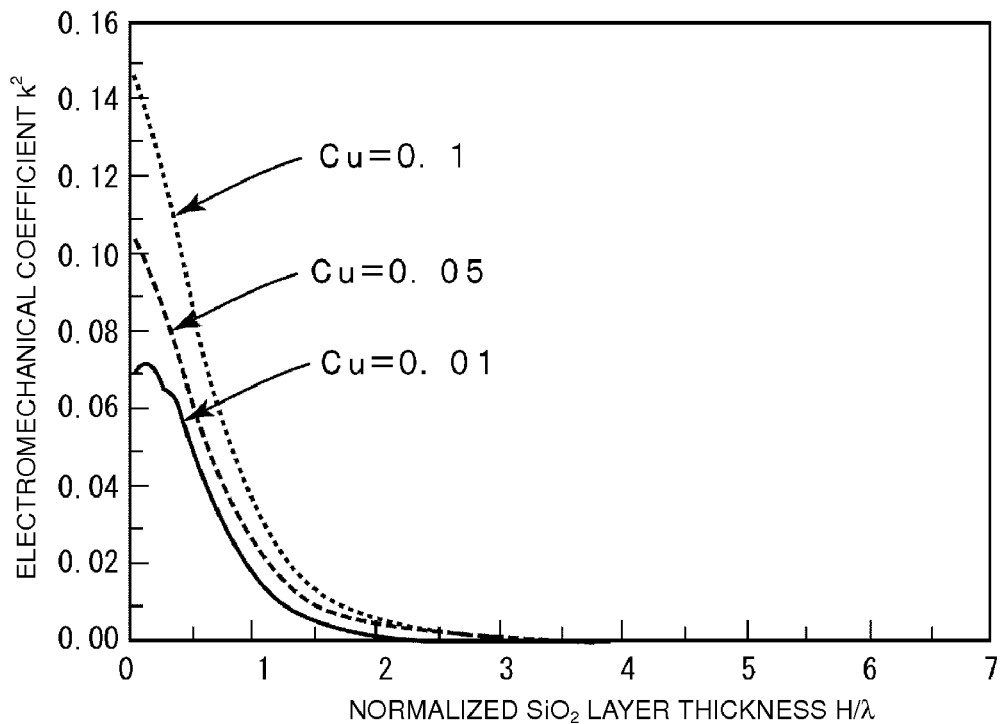
FIG. 22 is a graph showing the relationship between the normalized thickness H/λ of SiO$_2$ layers, the normalized thickness of Cu layers, and the electromechanical coefficient k$^2$ of structures in which embedded electrodes made of Cu are provided in LiTaO$_3$ with Euler angles (0°, 126°, 0°) and SiO$_2$ is provided on the electrodes.
Figure 23:
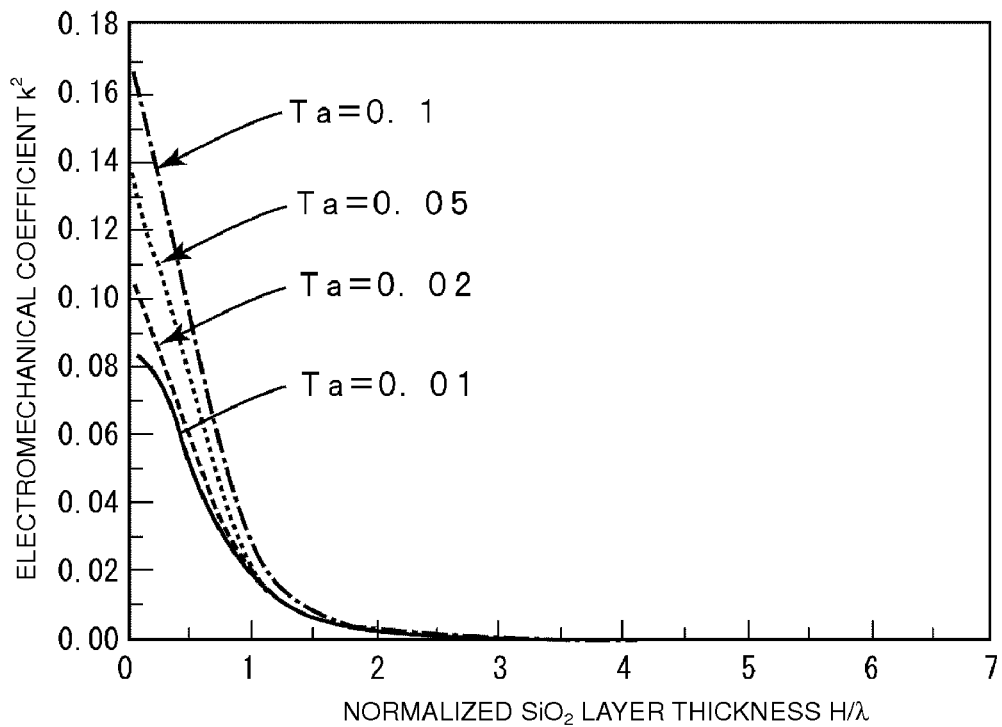
FIG. 23 is a graph showing the relationship between the normalized thickness H/λ of SiO$_2$ layers, the normalized thickness of Ta layers, and the electromechanical coefficient k$^2$ of structures in which embedded electrodes made of Ta are provided in LiTaO$_3$ with Euler angles (0°, 126°, 0°) and SiO$_2$ is provided on the electrodes.
Figure 24:
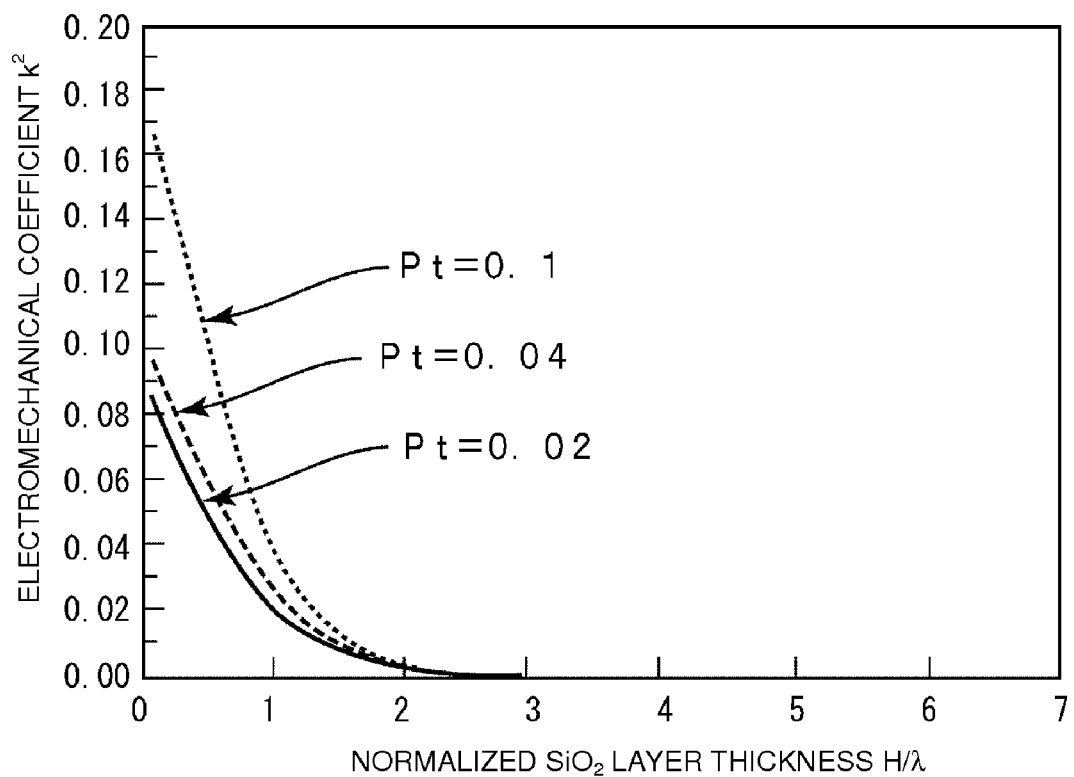
FIG. 24 is a graph showing the relationship between the normalized thickness H/λ of SiO$_2$ layers, the normalized thickness of Pt layers, and the electromechanical coefficient k$^2$ of structures in which embedded electrodes made of Pt are provided in LiTaO$_3$ with Euler angles (0°, 126°, 0°) and SiO$_2$ is provided on the electrodes.

FIG. 15 shows results obtained using Al as an electrode material, FIG. 16 shows results obtained using Cu as an electrode material, and FIG. 17 shows results obtained using Au as a metal material for the electrodes.

Electromechanical coefficients were determined such that LiTaO₃ with Euler angles (0°, 126°, 0°) were used to prepare the LiTaO₃ substrates and the thickness of the electrodes and the type of metal material used for the electrodes were varied. The obtained results are shown in FIGS. 20 to 24. FIGS. 20 to 24 show the results obtained using Al, Au, Cu, Ta, and Pt as metal materials for the electrodes.

As shown in FIGS. 20 to 24, when using the LiTaO₃ substrates, an increase in the thickness of SiO₂ layers reduces the electromechanical coefficient $k^2$. The thickness of SiO₂ layers may be selected such that an electromechanical coefficient $k^2$ suitable for the application is obtained.

The results shown in FIGS. 15 to 19 and 20 to 24 show that the use of LiTaO₃ substrates, as well as the use of LiNbO₃ substrates, having Euler angles (0°, θ, −45° to +45°) provides a boundary acoustic wave device with low loss and utilizing an SiO-type boundary acoustic wave when θ of the Euler angles, the thickness of electrodes, and the thickness of a SiO₂ layer are within any of the ranges shown in Tables 13 to 22.

TABLE 13

$\alpha \leq 0.1$

| Al | θ (degrees) | SiO₂ |
|---|---|---|
| 0.04 to 0.08 | 112 to 141 | 0.8 to 2.5 |
| 0.08 to 0.1 | 111 to 142 | 0.8 to 2.5 |
| 0.1 to 0.25 | 110 to 143 | 0.8 to 2.5 |

TABLE 14

$a \approx 0$

| Al | θ (degrees) | SiO₂ |
|---|---|---|
| 0.04 to 0.08 | 124 to 128 | 0.8 to 2.5 |
| 0.08 to 0.1 | 124 to 128 | 0.8 to 2.5 |
| 0.1 to 0.25 | 124 to 128 | 0.8 to 2.5 |

TABLE 15

$\alpha \leq 0.1$

| Cu | θ (degrees) | SiO₂ |
|---|---|---|
| 0.02 to 0.04 | 114 to 142 | 0.8 to 2.5 |
| 0.04 to 0.08 | 113 to 145 | 0.8 to 2.5 |
| 0.08 to 0.1 | 108 to 154 | 0.8 to 2.5 |

TABLE 16

| Cu | θ (degrees) | SiO₂ |
|---|---|---|
| α ≈ 0 | | |
| 0.02 to 0.04 | 127 to 129 | 0.8 to 2.5 |
| 0.04 to 0.08 | 127 to 131 | 0.8 to 2.5 |
| 0.08 to 0.1 | 127 to 135 | 0.8 to 2.5 |

TABLE 17

| Au | θ (degrees) | SiO₂ |
|---|---|---|
| α ≦ 0.1 | | |
| 0.02 to 0.03 | 117 to 148 | 0.8 to 2.5 |
| 0.03 to 0.06 | 109 to 159 | 0.8 to 2.5 |
| 0.06 to 0.1 | 103 to 167 | 0.8 to 2.5 |

TABLE 18

| Au | θ (degrees) | SiO₂ |
|---|---|---|
| α ≈ 0 | | |
| 0.02 to 0.03 | 135 to 136 | 0.8 to 2.5 |
| 0.03 to 0.06 | 135 to 139 | 0.8 to 2.5 |
| 0.06 to 0.1 | 135 to 140 | 0.8 to 2.5 |

TABLE 19

| Ta | θ (degrees) | SiO₂ |
|---|---|---|
| α ≦ 0.1 | | |
| 0.03 to 0.06 | 116 to 145 | 0.8 to 2.5 |
| 0.06 to 0.08 | 116 to 147 | 0.8 to 2.5 |
| 0.08 to 0.1 | 111 to 154 | 0.8 to 2.5 |

TABLE 20

| Ta | θ (degrees) | SiO₂ |
|---|---|---|
| α ≈ 0 | | |
| 0.03 to 0.06 | 129 to 134 | 0.8 to 2.5 |
| 0.06 to 0.08 | 129 to 134 | 0.8 to 2.5 |
| 0.08 to 0.1 | 129 to 136 | 0.8 to 2.5 |

TABLE 21

| Pt | θ (degrees) | SiO₂ |
|---|---|---|
| α ≦ 0.1 | | |
| 0.02 to 0.04 | 117 to 143 | 0.8 to 2.5 |
| 0.04 to 0.08 | 117 to 148 | 0.8 to 2.5 |
| 0.08 to 0.1 | 110 to 157 | 0.8 to 2.5 |

TABLE 22

| Pt | θ (degrees) | SiO₂ |
|---|---|---|
| α ≈ 0 | | |
| 0.02 to 0.04 | 130 to 131 | 0.8 to 2.5 |
| 0.04 to 0.08 | 133 to 135 | 0.8 to 2.5 |
| 0.08 to 0.1 | 133 to 138 | 0.8 to 2.5 |

The analysis of the data in Tables 13 to 22 shows that a boundary acoustic wave device having low loss is obtained if any of the ranges shown in Tables 23 and 24 is satisfied. More preferably, any of the ranges shown in Table 24 is satisfied because the loss thereof is further reduced.

TABLE 23

α ≦ 0.1
θ of Euler angles (0°, θ, −45° to 45°)

| Electrode thickness | (0°, θ, −45° to 45°) | Dielectric layer thickness |
|---|---|---|
| 0.04 ≦ Thickness of Al electrode < 0.08 | (0, 112 to 141, −45 to 45) | 0.8 ≦ Thickness of dielectric layer ≦ 2.5 |
| 0.08 ≦ Thickness of Al electrode < 0.1 | (0, 111 to 142, −45 to 45) | 0.8 ≦ Thickness of dielectric layer ≦ 2.5 |
| 0.1 ≦ Thickness of Al electrode ≦ 0.25 | (0, 110 to 143, −45 to 45) | 0.8 ≦ Thickness of dielectric layer ≦ 2.5 |
| 0.02 ≦ Thickness of Cu electrode < 0.04 | (0, 114 to 142, −45 to 45) | 0.8 ≦ Thickness of dielectric layer ≦ 2.5 |
| 0.04 ≦ Thickness of Cu electrode < 0.08 | (0, 113 to 145, −45 to 45) | 0.8 ≦ Thickness of dielectric layer ≦ 2.5 |
| 0.08 ≦ Thickness of Cu electrode ≦ 0.1 | (0, 108 to 154, −45 to 45) | 0.8 ≦ Thickness of dielectric layer ≦ 2.5 |
| 0.02 ≦ Thickness of Au electrode < 0.03 | (0, 117 to 148, −45 to 45) | 0.8 ≦ Thickness of dielectric layer ≦ 2.5 |
| 0.03 ≦ Thickness of Au electrode < 0.06 | (0, 109 to 159, −45 to 45) | 0.8 ≦ Thickness of dielectric layer ≦ 2.5 |
| 0.06 ≦ Thickness of Au electrode ≦ 0.1 | (0, 103 to 167, −45 to 45) | 0.8 ≦ Thickness of dielectric layer ≦ 2.5 |
| 0.03 ≦ Thickness of Ta electrode < 0.06 | (0, 116 to 145, −45 to 45) | 0.8 ≦ Thickness of dielectric layer ≦ 2.5 |
| 0.06 ≦ Thickness of Ta electrode < 0.08 | (0, 116 to 147, −45 to 45) | 0.8 ≦ Thickness of dielectric layer ≦ 2.5 |
| 0.08 ≦ Thickness of Ta electrode ≦ 0.1 | (0, 111 to 154, −45 to 45) | 0.8 ≦ Thickness of dielectric layer ≦ 2.5 |
| 0.02 ≦ Thickness of Pt electrode < 0.04 | (0, 117 to 143, −45 to 45) | 0.8 ≦ Thickness of dielectric layer ≦ 2.5 |
| 0.04 ≦ Thickness of Pt electrode < 0.08 | (0, 117 to 148, −45 to 45) | 0.8 ≦ Thickness of dielectric layer ≦ 2.5 |
| 0.08 ≦ Thickness of Pt electrode ≦ 0.1 | (0, 110 to 157, −45 to 45) | 0.8 ≦ Thickness of dielectric layer ≦ 2.5 |

The thickness of each electrode and the thickness of a dielectric layer are normalized thickness H/λ (λ is the wavelength of a boundary acoustic wave).

TABLE 24

α = 0
θ of Euler angles (0°, θ, −45° to 45°)

| Electrode thickness | (0°, θ, −45° to 45°) | Dielectric layer thickness |
|---|---|---|
| 0.04 ≦ Thickness of Al electrode ≦ 0.08 | (0, 124 to 128, -45 to 45) | 0.8 ≦ Thickness of dielectric layer ≦ 2.5 |
| 0.08 ≦ Thickness of Al electrode ≦ 0.1 | (0, 124 to 128, -45 to 45) | 0.8 ≦ Thickness of dielectric layer ≦ 2.5 |
| 0.1 ≦ Thickness of Al electrode ≦ 0.25 | (0, 124 to 128, -45 to 45) | 0.8 ≦ Thickness of dielectric layer ≦ 2.5 |
| 0.02 ≦ Thickness of Cu electrode ≦ 0.04 | (0, 127 to 129, -45 to 45) | 0.8 ≦ Thickness of dielectric layer ≦ 2.5 |
| 0.04 ≦ Thickness of Cu electrode ≦ 0.08 | (0, 127 to 131, -45 to 45) | 0.8 ≦ Thickness of dielectric layer ≦ 2.5 |
| 0.08 ≦ Thickness of Cu electrode ≦ 0.1 | (0, 127 to 135, -45 to 45) | 0.8 ≦ Thickness of dielectric layer ≦ 2.5 |
| 0.02 ≦ Thickness of Au electrode ≦ 0.03 | (0, 135 to 136, -45 to 45) | 0.8 ≦ Thickness of dielectric layer ≦ 2.5 |
| 0.03 ≦ Thickness of Au electrode ≦ 0.06 | (0, 135 to 139, -45 to 45) | 0.8 ≦ Thickness of dielectric layer ≦ 2.5 |
| 0.06 ≦ Thickness of Au electrode ≦ 0.1 | (0, 135 to 140, -45 to 45) | 0.8 ≦ Thickness of dielectric layer ≦ 2.5 |

TABLE 24-continued $\alpha = 0$
θ of Euler angles (0°, θ, −45° to 45°)

| | | |
|---|---|---|
| 0.03 ≦ Thickness of Ta electrode ≦ 0.06 | (0, 129 to 134, -45 to 45) | 0.8 ≦ Thickness of dielectric layer ≦ 2.5 |
| 0.06 ≦ Thickness of Ta electrode ≦ 0.08 | (0, 129 to 134, -45 to 45) | 0.8 ≦ Thickness of dielectric layer ≦ 2.5 |
| 0.08 ≦ Thickness of Ta electrode ≦ 0.1 | (0, 129 to 136, -45 to 45) | 0.8 ≦ Thickness of dielectric layer ≦ 2.5 |
| 0.02 ≦ Thickness of Pt electrode ≦ 0.04 | (0, 130 to 131, -45 to 45) | 0.8 ≦ Thickness of dielectric layer ≦ 2.5 |
| 0.04 ≦ Thickness of Pt electrode ≦ 0.08 | (0, 133 to 135, -45 to 45) | 0.8 ≦ Thickness of dielectric layer ≦ 2.5 |
| 0.08 ≦ Thickness of Pt electrode ≦ 0.1 | (0, 133 to 138, -45 to 45) | 0.8 ≦ Thickness of dielectric layer ≦ 2.5 |

The thickness of each electrode and the thickness of a dielectric layer are normalized thickness H/λ (λ is the wavelength of a boundary acoustic wave).

In the preferred embodiments described above, the IDT electrodes are preferably made of a single metal such as Al or Au, for example. However, the IDT electrodes may preferably have a multilayer structure in which an electrode layer primarily including such a metal is disposed on another electrode layer made of another metal material.

The dielectric layers may preferably be made of another dielectric material having an acoustic wave velocity of a transverse wave greater than that of the electrodes. Examples of such a dielectric material include glass, $Si_xN_y$, SiC, and $Al_2O_3$. When the dielectric layers are made of any one of these materials, the thickness thereof may be determined in inverse proportion to the acoustic wave velocity of a transverse wave of $SiO_2$.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
a $LiNbO_3$ substrate including a plurality of grooves provided in an upper surface thereof and having Euler angles (0°, θ, −45° to +45°);
electrodes defined by metal material filled in the grooves; and
a silicon dioxide layer arranged over the $LiNbO_3$ substrate and the electrodes; wherein
the upper surface of the silicon dioxide layer is flat or substantially flat;
the metal material defining the electrodes is Au; and
a thickness of the electrodes made of Au, θ of the Euler angles of the $LiNbO_3$ substrate, and the thickness of the silicon dioxide layer are within any of the ranges shown in the table below:

$\alpha \leq 0.1$
θ of Euler angles (0°, θ, −45° to 45°)

| | | |
|---|---|---|
| 0.01 ≦ Thickness of Au electrode < 0.02 | (0, 61 to 112, −45 to 45) | 0.8 ≦ Thickness of silicon dioxide layer ≦ 4.0 |
| 0.02 ≦ Thickness of Au electrode < 0.06 | (0, 60 to 122, −45 to 45) | 0.8 ≦ Thickness of silicon dioxide layer ≦ 4.0 |
| 0.06 ≦ Thickness of Au electrode < 0.08 | (0, 56 to 132, −45 to 45) | 0.8 ≦ Thickness of silicon dioxide layer ≦ 4.0 |
| 0.08 ≦ Thickness of Au electrode ≦ 0.10 | (0, 51 to 136, −45 to 45) | 0.8 ≦ Thickness of silicon dioxide layer ≦ 4.0 |

The thickness of each electrode and the thickness of a silicon dioxide layer are normalized thickness H/λ (λ is the wavelength of a boundary acoustic wave).

2. The boundary acoustic wave device according to claim 1, wherein the thickness of the electrodes, θ of the Euler angles of the $LiNbO_3$ substrate, and the thickness of the silicon dioxide layer are within any of the ranges shown in the table below:

$\alpha = 0.1$
θ of Euler angles (0°, θ, −45° to 45°)

| | | |
|---|---|---|
| 0.01 ≦ Thickness of Au electrode < 0.02 | (0, 68 to 103, −45 to 45) | 0.8 ≦ Thickness of silicon dioxide layer ≦ 4.0 |
| 0.02 ≦ Thickness of Au electrode < 0.06 | (0, 68 to 113, −45 to 45) | 0.8 ≦ Thickness of silicon dioxide layer ≦ 4.0 |
| 0.06 ≦ Thickness of Au electrode < 0.08 | (0, 68 to 126, −45 to 45) | 0.8 ≦ Thickness of silicon dioxide layer ≦ 4.0 |
| 0.08 ≦ Thickness of Au electrode ≦ 0.10 | (0, 68 to 140, −45 to 45) | 0.8 ≦ Thickness of silicon dioxide layer ≦ 4.0 |

The thickness of each electrode and the thickness of a silicon dioxide layer are normalized thickness H/λ (λ is the wavelength of a boundary acoustic wave).

3. The boundary acoustic wave device according to claim 1, wherein the electrodes are interdigital electrodes.

* * * * *